(12) United States Patent
Warnick

(10) Patent No.: US 8,195,118 B2
(45) Date of Patent: Jun. 5, 2012

(54) APPARATUS, SYSTEM, AND METHOD FOR INTEGRATED PHASE SHIFTING AND AMPLITUDE CONTROL OF PHASED ARRAY SIGNALS

(75) Inventor: Karl F. Warnick, Spanish Fork, UT (US)

(73) Assignee: Linear Signal, Inc., Spanish Fork, UT (US)

( * ) Notice: Subject to any disclaimer, the term of this patent is extended or adjusted under 35 U.S.C. 154(b) by 373 days.

(21) Appl. No.: 12/503,761

(22) Filed: Jul. 15, 2009

(65) Prior Publication Data

US 2010/0013527 A1   Jan. 21, 2010

Related U.S. Application Data

(60) Provisional application No. 61/080,965, filed on Jul. 15, 2008.

(51) Int. Cl.
*H04B 1/06* (2006.01)
*H04B 7/185* (2006.01)
*H01Q 3/00* (2006.01)

(52) U.S. Cl. ............ 455/272; 455/276.1; 455/289; 342/354; 342/368; 342/372

(58) Field of Classification Search ............ 455/276.1, 455/272, 289, 318, 256, 258, 562.1, 503, 455/506; 342/350, 354, 368, 372, 375
See application file for complete search history.

(56) References Cited

U.S. PATENT DOCUMENTS

| | | | |
|---|---|---|---|
| 4,166,274 A * | 8/1979 | Reudink et al. | 342/376 |
| 5,019,793 A * | 5/1991 | McNab | 333/156 |
| 5,059,982 A | 10/1991 | Bacrania et al. | |
| 5,065,123 A | 11/1991 | Heckaman et al. | |
| 5,070,451 A | 12/1991 | Moore et al. | |
| 5,096,670 A | 3/1992 | Harris et al. | |
| 5,113,361 A | 5/1992 | Damerow et al. | |
| 5,131,272 A | 7/1992 | Minei et al. | |
| 5,138,319 A | 8/1992 | Tesch | |
| 5,150,120 A | 9/1992 | Yunus | |
| 5,164,627 A | 11/1992 | Popek | |
| 5,173,790 A | 12/1992 | Montgomery | |
| 5,181,207 A | 1/1993 | Chapman | |
| 5,206,600 A | 4/1993 | Moehlmann | |
| 5,218,373 A | 6/1993 | Heckaman et al. | |
| 5,225,823 A | 7/1993 | Kanaly | |
| 5,258,939 A | 11/1993 | Johnstone et al. | |
| 5,276,633 A | 1/1994 | Fox et al. | |
| 5,299,300 A | 3/1994 | Femal et al. | |
| 5,309,125 A | 5/1994 | Perkins et al. | |
| 5,311,070 A | 5/1994 | Dooley | |

(Continued)

*Primary Examiner* — Duc M Nguyen
(74) *Attorney, Agent, or Firm* — Kunzler Needham Massey & Thorpe

(57) ABSTRACT

An apparatus, system, and method are disclosed for phase shifting and amplitude control. A two-phase local oscillator generates an in-phase sinusoidal signal of a fixed frequency and a quadrature sinusoidal signal of the fixed frequency having a ninety degree phase shift from the in-phase sinusoidal signal. A signal generator receives the in-phase sinusoidal signal and the quadrature sinusoidal signal and generates a controllable sinusoidal signal of the fixed frequency. The controllable sinusoidal signal has a variable amplitude and a shiftable phase. A mixer varies the amplitude and shifts the phase of an input signal by mixing the input signal with the controllable sinusoidal signal to generate an output signal. The input signal and the output signal carry phase and amplitude information required for phased array signal processing. Either a receiver or a transmitter may be implemented using the present invention.

19 Claims, 8 Drawing Sheets

U.S. PATENT DOCUMENTS

| | | | |
|---|---|---|---|
| 5,353,870 A | 10/1994 | Harris | |
| 5,369,309 A | 11/1994 | Bacrania et al. | |
| 5,382,916 A | 1/1995 | King et al. | |
| 5,386,194 A | 1/1995 | Moehlmann | |
| 5,390,364 A | 2/1995 | Webster et al. | |
| 5,412,426 A | 5/1995 | Totty | |
| 5,450,339 A | 9/1995 | Chester et al. | |
| 5,463,656 A | 10/1995 | Polivka et al. | |
| 5,471,131 A | 11/1995 | King et al. | |
| 5,481,129 A | 1/1996 | DeJong et al. | |
| 5,493,581 A | 2/1996 | Young et al. | |
| 5,548,542 A | 8/1996 | Rauth et al. | |
| 5,563,834 A | 10/1996 | Longway et al. | |
| 5,570,392 A | 10/1996 | Young et al. | |
| 5,574,572 A | 11/1996 | Malinowski et al. | |
| 5,574,671 A | 11/1996 | Young et al. | |
| 5,581,475 A | 12/1996 | Majors | |
| 5,583,856 A | 12/1996 | Weir | |
| 5,617,344 A | 4/1997 | Young et al. | |
| 5,619,496 A | 4/1997 | Weir | |
| 5,631,599 A | 5/1997 | Bacrania et al. | |
| 5,633,815 A | 5/1997 | Young | |
| 5,648,999 A | 7/1997 | Easterling et al. | |
| 5,651,049 A | 7/1997 | Easterling et al. | |
| 5,655,149 A | 8/1997 | Muegge et al. | |
| 5,659,261 A | 8/1997 | Bacrania et al. | |
| 5,687,196 A | 11/1997 | Proctor, Jr. et al. | |
| 5,701,097 A | 12/1997 | Fisher et al. | |
| 5,702,100 A | 12/1997 | Novick et al. | |
| 5,710,520 A | 1/1998 | Frey | |
| 5,719,584 A | 2/1998 | Otto | |
| 5,724,347 A | 3/1998 | Bell et al. | |
| 5,736,903 A | 4/1998 | Myers et al. | |
| 5,748,627 A | 5/1998 | Weir | |
| 5,757,263 A | 5/1998 | Ravindranathan | |
| 5,757,794 A | 5/1998 | Young | |
| 5,767,757 A | 6/1998 | Prentice | |
| 5,778,317 A | 7/1998 | Kaminsky | |
| 5,798,724 A | 8/1998 | Myers | |
| 5,802,211 A | 9/1998 | King | |
| 5,805,317 A | 9/1998 | Snawerdt, III et al. | |
| 5,825,621 A | 10/1998 | Giannatto et al. | |
| 5,828,664 A | 10/1998 | Weir | |
| 5,828,773 A | 10/1998 | Setlak et al. | |
| 5,835,062 A | 11/1998 | Heckaman et al. | |
| 5,835,349 A | 11/1998 | Giannatto et al. | |
| 5,852,670 A | 12/1998 | Setlak et al. | |
| 5,857,113 A | 1/1999 | Muegge et al. | |
| 5,861,858 A | 1/1999 | Niekamp | |
| 5,892,375 A | 4/1999 | Vulih et al. | |
| 5,892,480 A | 4/1999 | Killen | |
| 5,894,983 A | 4/1999 | Beck et al. | |
| 5,903,225 A | 5/1999 | Schmitt et al. | |
| 5,907,304 A | 5/1999 | Wilson et al. | |
| 5,920,640 A | 7/1999 | Salatino et al. | |
| 5,936,868 A | 8/1999 | Hall | |
| 5,940,045 A | 8/1999 | Belcher et al. | |
| 5,940,526 A | 8/1999 | Setlak et al. | |
| 5,952,982 A | 9/1999 | Jorgenson et al. | |
| 5,953,379 A | 9/1999 | Myers et al. | |
| 5,953,441 A | 9/1999 | Setlak | |
| 5,956,415 A | 9/1999 | McCalley et al. | |
| 5,960,047 A | 9/1999 | Proctor, Jr. et al. | |
| 5,963,679 A | 10/1999 | Setlak | |
| RE36,388 E | 11/1999 | Fox et al. | |
| 5,982,619 A | 11/1999 | Giannatto et al. | |
| 5,990,830 A | 11/1999 | Vail et al. | |
| 5,995,062 A | 11/1999 | Denney et al. | |
| 5,999,145 A | 12/1999 | Niekamp | |
| 6,020,862 A | 2/2000 | Newton et al. | |
| 6,028,494 A | 2/2000 | May et al. | |
| 6,038,271 A | 3/2000 | Olaker et al. | |
| 6,043,722 A | 3/2000 | Vaninetti et al. | |
| 6,047,165 A | 4/2000 | Wright et al. | |
| 6,052,098 A | 4/2000 | Killen et al. | |
| 6,055,021 A | 4/2000 | Twitchell | |
| 6,061,228 A | 5/2000 | Palmer et al. | |
| 6,081,158 A | 6/2000 | Twitchell et al. | |
| 6,091,522 A | 7/2000 | Snawerdt, III et al. | |
| 6,091,765 A | 7/2000 | Pietzold, III et al. | |
| 6,097,260 A | 8/2000 | Whybrew et al. | |
| 6,104,914 A | 8/2000 | Wright et al. | |
| 6,108,523 A | 8/2000 | Wright et al. | |
| 6,115,005 A | 9/2000 | Goldstein et al. | |
| 6,130,585 A | 10/2000 | Whybrew et al. | |
| 6,140,978 A | 10/2000 | Patenaude et al. | |
| 6,144,704 A * | 11/2000 | Startup et al. | 375/260 |
| 6,147,657 A | 11/2000 | Hildebrand et al. | |
| 6,148,179 A | 11/2000 | Wright et al. | |
| 6,154,636 A | 11/2000 | Wright et al. | |
| 6,154,637 A | 11/2000 | Wright et al. | |
| 6,160,998 A | 12/2000 | Wright et al. | |
| 6,163,681 A | 12/2000 | Wright et al. | |
| 6,166,705 A | 12/2000 | Mast et al. | |
| 6,166,709 A | 12/2000 | Goldstein | |
| 6,167,238 A | 12/2000 | Wright | |
| 6,167,239 A | 12/2000 | Wright et al. | |
| 6,172,652 B1 | 1/2001 | Plonka | |
| 6,173,159 B1 | 1/2001 | Wright et al. | |
| 6,181,296 B1 | 1/2001 | Kulisan et al. | |
| 6,181,450 B1 | 1/2001 | Dishman et al. | |
| 6,184,463 B1 | 2/2001 | Panchou et al. | |
| 6,184,826 B1 | 2/2001 | Walley et al. | |
| 6,185,255 B1 | 2/2001 | Twitchell et al. | |
| 6,188,915 B1 | 2/2001 | Martin et al. | |
| 6,195,060 B1 | 2/2001 | Spano et al. | |
| 6,195,062 B1 | 2/2001 | Killen et al. | |
| 6,204,823 B1 | 3/2001 | Spano et al. | |
| 6,205,253 B1 | 3/2001 | King | |
| 6,218,214 B1 | 4/2001 | Panchou et al. | |
| 6,219,004 B1 | 4/2001 | Johnson | |
| 6,222,658 B1 | 4/2001 | Dishman et al. | |
| 6,226,531 B1 | 5/2001 | Holt et al. | |
| 6,236,362 B1 | 5/2001 | Walley et al. | |
| 6,236,371 B1 | 5/2001 | Beck | |
| 6,240,290 B1 | 5/2001 | Willingham et al. | |
| 6,243,051 B1 | 6/2001 | Vanstrum et al. | |
| 6,243,052 B1 | 6/2001 | Goldstein et al. | |
| 6,246,498 B1 | 6/2001 | Dishman et al. | |
| 6,259,544 B1 | 7/2001 | Dishman et al. | |
| 6,266,015 B1 | 7/2001 | Heckaman et al. | |
| 6,269,125 B1 | 7/2001 | Seccia et al. | |
| 6,271,799 B1 | 8/2001 | Rief et al. | |
| 6,271,953 B1 | 8/2001 | Dishman et al. | |
| 6,275,120 B1 | 8/2001 | Vaninetti et al. | |
| 6,281,935 B1 | 8/2001 | Twitchell et al. | |
| 6,281,936 B1 | 8/2001 | Twitchell et al. | |
| 6,285,255 B1 | 9/2001 | Luu et al. | |
| 6,289,487 B1 | 9/2001 | Hessel et al. | |
| 6,292,133 B1 | 9/2001 | Lynch | |
| 6,292,654 B1 | 9/2001 | Hessel et al. | |
| 6,292,665 B1 | 9/2001 | Hildebrand et al. | |
| 6,297,764 B1 | 10/2001 | Wormington et al. | |
| 6,300,906 B1 | 10/2001 | Rawnick et al. | |
| 6,307,510 B1 | 10/2001 | Taylor et al. | |
| 6,307,523 B1 | 10/2001 | Green et al. | |
| 6,308,044 B1 | 10/2001 | Wright et al. | |
| 6,308,045 B1 | 10/2001 | Wright et al. | |
| 6,320,546 B1 | 11/2001 | Newton et al. | |
| 6,320,553 B1 | 11/2001 | Ergene | |
| 6,323,819 B1 | 11/2001 | Ergene | |
| 6,333,981 B1 | 12/2001 | Weir et al. | |
| 6,335,766 B1 | 1/2002 | Twitchell et al. | |
| 6,335,767 B1 | 1/2002 | Twitchell et al. | |
| 6,342,870 B1 | 1/2002 | Mehrkens et al. | |
| 6,343,151 B1 | 1/2002 | King | |
| 6,343,207 B1 | 1/2002 | Hessel et al. | |
| 6,344,830 B1 | 2/2002 | Taylor | |
| 6,351,880 B1 | 3/2002 | Palmer et al. | |
| 6,353,640 B1 | 3/2002 | Hessel et al. | |
| 6,353,734 B1 | 3/2002 | Wright et al. | |
| 6,356,240 B1 | 3/2002 | Taylor | |
| 6,359,897 B1 | 3/2002 | Hessel et al. | |
| 6,370,659 B1 | 4/2002 | Maney | |
| 6,381,265 B1 | 4/2002 | Hessel et al. | |
| 6,384,773 B1 | 5/2002 | Martin et al. | |
| 6,384,780 B2 | 5/2002 | Walley et al. | |

| Patent No. | Date | Name |
|---|---|---|
| 6,388,621 B1 | 5/2002 | Lynch |
| 6,389,078 B1 | 5/2002 | Hessel et al. |
| 6,390,672 B1 | 5/2002 | Vail et al. |
| 6,397,083 B2 | 5/2002 | Martin et al. |
| 6,400,415 B1 | 6/2002 | Danielsons |
| 6,407,717 B2 | 6/2002 | Killen et al. |
| 6,411,612 B1 | 6/2002 | Halford et al. |
| 6,417,813 B1 | 7/2002 | Durham |
| 6,418,019 B1 | 7/2002 | Snyder et al. |
| 6,421,004 B2 | 7/2002 | Walley et al. |
| 6,421,012 B1 | 7/2002 | Heckaman |
| 6,421,022 B1 | 7/2002 | Patenaude et al. |
| 6,421,023 B1 | 7/2002 | Phelan |
| 6,424,685 B1 | 7/2002 | Messel et al. |
| 6,429,816 B1 | 8/2002 | Whybrew et al. |
| 6,434,200 B1 | 8/2002 | Hessel |
| 6,437,965 B1 | 8/2002 | Adkins et al. |
| 6,438,182 B1 | 8/2002 | Olaker et al. |
| 6,441,783 B1 * | 8/2002 | Dean ............................. 342/372 |
| 6,441,801 B1 | 8/2002 | Knight et al. |
| 6,452,798 B1 | 9/2002 | Smith et al. |
| 6,456,244 B1 | 9/2002 | Goldstein et al. |
| 6,466,649 B1 | 10/2002 | Walance et al. |
| 6,466,773 B1 | 10/2002 | Johnson |
| 6,473,037 B2 | 10/2002 | Vail et al. |
| 6,473,133 B1 | 10/2002 | Twitchell et al. |
| 6,483,464 B2 | 11/2002 | Rawnick et al. |
| 6,483,705 B2 | 11/2002 | Snyder et al. |
| 6,492,903 B1 | 12/2002 | Ranon |
| 6,493,405 B1 | 12/2002 | Olaker et al. |
| 6,496,143 B1 | 12/2002 | Vail et al. |
| 6,501,437 B1 | 12/2002 | Gyorko et al. |
| 6,501,805 B1 | 12/2002 | Twitchell |
| 6,504,515 B1 | 1/2003 | Holt et al. |
| 6,512,487 B1 | 1/2003 | Taylor et al. |
| 6,519,010 B2 | 2/2003 | Twitchell et al. |
| 6,522,293 B2 | 2/2003 | Vail et al. |
| 6,522,294 B2 | 2/2003 | Vail et al. |
| 6,522,296 B2 | 2/2003 | Holt |
| 6,522,437 B2 | 2/2003 | Presley et al. |
| 6,522,867 B1 | 2/2003 | Wright et al. |
| 6,535,397 B2 | 3/2003 | Clark et al. |
| 6,535,554 B1 | 3/2003 | Webster et al. |
| 6,539,052 B1 | 3/2003 | Hessel et al. |
| 6,542,132 B2 | 4/2003 | Stern |
| 6,542,244 B1 | 4/2003 | Rumpf et al. |
| 6,545,648 B1 | 4/2003 | Plonka |
| 6,552,687 B1 | 4/2003 | Rawnick et al. |
| 6,563,472 B2 | 5/2003 | Durham et al. |
| 6,573,862 B2 | 6/2003 | Vail et al. |
| 6,573,863 B2 | 6/2003 | Vail et al. |
| 6,580,393 B2 | 6/2003 | Holt |
| 6,583,766 B1 | 6/2003 | Rawnick et al. |
| 6,587,077 B2 | 7/2003 | Vail et al. |
| 6,587,670 B1 | 7/2003 | Hoyt et al. |
| 6,590,942 B1 | 7/2003 | Hessel et al. |
| 6,591,375 B1 | 7/2003 | Hu |
| 6,593,881 B2 | 7/2003 | Vail et al. |
| 6,597,668 B1 | 7/2003 | Schafer et al. |
| 6,600,516 B1 | 7/2003 | Danielsons et al. |
| 6,606,055 B2 | 8/2003 | Halsema et al. |
| 6,608,593 B2 | 8/2003 | Holt |
| 6,611,230 B2 | 8/2003 | Phelan |
| 6,628,851 B1 | 9/2003 | Rumpf et al. |
| 6,646,600 B2 | 11/2003 | Vail et al. |
| 6,646,614 B2 | 11/2003 | Killen |
| 6,646,621 B1 | 11/2003 | Phelan et al. |
| 6,665,353 B1 * | 12/2003 | Nisbet ............................. 375/302 |
| 6,690,324 B2 | 2/2004 | Vail et al. |
| 6,708,032 B2 | 3/2004 | Willingham et al. |
| 6,711,528 B2 | 3/2004 | Dishman et al. |
| 6,717,549 B2 | 4/2004 | Rawnick et al. |
| 6,731,248 B2 | 5/2004 | Killen et al. |
| 6,734,827 B2 | 5/2004 | Killen et al. |
| 6,735,452 B1 | 5/2004 | Foster, Jr. et al. |
| 6,738,018 B2 | 5/2004 | Phelan et al. |
| 6,744,854 B2 | 6/2004 | Berrier et al. |
| 6,745,010 B2 | 6/2004 | Wright et al. |
| 6,748,240 B1 | 6/2004 | Foster, Jr. et al. |
| 6,751,266 B1 | 6/2004 | Danielsons |
| 6,753,744 B2 | 6/2004 | Killen et al. |
| 6,754,502 B2 | 6/2004 | Hildebrand et al. |
| 6,754,511 B1 | 6/2004 | Halford et al. |
| 6,771,221 B2 | 8/2004 | Rawnick et al. |
| 6,771,698 B1 | 8/2004 | Beck |
| 6,775,545 B2 | 8/2004 | Wright et al. |
| 6,778,516 B1 | 8/2004 | Foster, Jr. et al. |
| 6,781,540 B1 | 8/2004 | MacKey et al. |
| 6,781,560 B2 | 8/2004 | Goldstein |
| 6,788,268 B2 * | 9/2004 | Chiang et al. ............... 343/850 |
| 6,795,019 B2 | 9/2004 | Holt |
| 6,798,761 B2 | 9/2004 | Cain et al. |
| 6,804,208 B2 | 10/2004 | Cain et al. |
| 6,806,843 B2 | 10/2004 | Killen et al. |
| 6,812,906 B2 | 11/2004 | Goldstein et al. |
| 6,822,616 B2 | 11/2004 | Durham et al. |
| 6,824,307 B2 | 11/2004 | Vail et al. |
| 6,842,157 B2 | 1/2005 | Phelan et al. |
| 6,856,216 B1 | 2/2005 | Trosa et al. |
| 6,856,297 B1 | 2/2005 | Durham et al. |
| 6,861,975 B1 | 3/2005 | Coleman, Jr. et al. |
| 6,873,305 B2 | 3/2005 | Rawnick et al. |
| 6,876,274 B2 | 4/2005 | Brown et al. |
| 6,876,336 B2 | 4/2005 | Croswell et al. |
| 6,879,298 B1 | 4/2005 | Zarro et al. |
| 6,885,355 B2 | 4/2005 | Killen et al. |
| 6,888,500 B2 | 5/2005 | Brown et al. |
| 6,891,497 B2 | 5/2005 | Coleman, Jr. et al. |
| 6,891,501 B2 | 5/2005 | Rawnick et al. |
| 6,891,562 B2 | 5/2005 | Spence et al. |
| 6,894,550 B2 | 5/2005 | Trosa et al. |
| 6,894,582 B2 | 5/2005 | Whybrew et al. |
| 6,894,655 B1 | 5/2005 | Jones et al. |
| 6,897,829 B2 | 5/2005 | Oliver et al. |
| 6,900,763 B2 | 5/2005 | Killen et al. |
| 6,901,064 B2 | 5/2005 | Cain et al. |
| 6,901,123 B2 | 5/2005 | England |
| 6,903,703 B2 | 6/2005 | Durham et al. |
| 6,904,032 B2 | 6/2005 | Cain |
| 6,906,680 B2 | 6/2005 | Rawnick et al. |
| 6,909,404 B2 | 6/2005 | Rawnick et al. |
| 6,914,575 B2 | 7/2005 | Rawnick et al. |
| 6,927,745 B2 | 8/2005 | Brown et al. |
| 6,930,568 B2 | 8/2005 | Snyder et al. |
| 6,930,653 B2 | 8/2005 | Rawnick et al. |
| 6,931,362 B2 | 8/2005 | Beadle et al. |
| 6,937,120 B2 | 8/2005 | Fisher et al. |
| 6,943,699 B2 | 9/2005 | Ziarno |
| 6,943,731 B2 | 9/2005 | Killen et al. |
| 6,943,743 B2 | 9/2005 | Durham et al. |
| 6,943,748 B2 | 9/2005 | Durham et al. |
| 6,952,145 B2 | 10/2005 | Brown et al. |
| 6,952,148 B2 | 10/2005 | Snyder et al. |
| 6,954,179 B2 | 10/2005 | Durham et al. |
| 6,954,449 B2 | 10/2005 | Cain et al. |
| 6,956,532 B2 | 10/2005 | Durham et al. |
| 6,958,738 B1 | 10/2005 | Durham et al. |
| 6,958,986 B2 | 10/2005 | Cain |
| 6,960,965 B2 | 11/2005 | Rawnick et al. |
| 6,961,501 B2 | 11/2005 | Matsuura et al. |
| 6,965,355 B1 | 11/2005 | Durham et al. |
| 6,975,268 B2 | 12/2005 | Coleman et al. |
| 6,977,623 B2 | 12/2005 | Durham et al. |
| 6,982,987 B2 | 1/2006 | Cain |
| 6,985,118 B2 | 1/2006 | Zarro et al. |
| 6,985,119 B2 | 1/2006 | Smyth et al. |
| 6,990,319 B2 | 1/2006 | Wright et al. |
| 6,992,628 B2 | 1/2006 | Rawnick et al. |
| 6,993,440 B2 | 1/2006 | Anderson et al. |
| 6,993,460 B2 | 1/2006 | Beadle et al. |
| 6,995,711 B2 | 2/2006 | Killen et al. |
| 6,998,937 B2 | 2/2006 | Brown et al. |
| 6,999,044 B2 | 2/2006 | Durham et al. |
| 6,999,163 B2 | 2/2006 | Pike |
| 7,006,052 B2 | 2/2006 | Delgado et al. |
| 7,009,570 B2 | 3/2006 | Durham et al. |
| 7,012,482 B2 | 3/2006 | Rawnick et al. |
| 7,023,384 B2 | 4/2006 | Brown et al. |

| Patent | Type | Date | Inventor(s) |
|---|---|---|---|
| 7,023,392 | B2 | 4/2006 | Brown et al. |
| 7,027,409 | B2 | 4/2006 | Cain |
| 7,030,834 | B2 | 4/2006 | Delgado et al. |
| 7,031,295 | B2 | 4/2006 | Schafer |
| 7,038,625 | B1 | 5/2006 | Taylor et al. |
| 7,046,104 | B2 | 5/2006 | Snyder et al. |
| 7,053,861 | B2 | 5/2006 | Rawnick et al. |
| 7,054,289 | B1 | 5/2006 | Foster, Jr. et al. |
| 7,068,219 | B2 | 6/2006 | Martin et al. |
| 7,068,605 | B2 | 6/2006 | Cain et al. |
| 7,068,774 | B1 | 6/2006 | Judkins et al. |
| 7,079,260 | B2 | 7/2006 | Montgomery |
| 7,079,552 | B2 | 7/2006 | Cain et al. |
| 7,079,576 | B2 | 7/2006 | Bologna et al. |
| 7,084,827 | B1 | 8/2006 | Strange et al. |
| 7,085,290 | B2 | 8/2006 | Cain et al. |
| 7,085,539 | B2 | 8/2006 | Furman |
| 7,088,308 | B2 | 8/2006 | Delgado et al. |
| 7,102,588 | B1 | 9/2006 | Phelan et al. |
| 7,110,779 | B2 | 9/2006 | Billhartz et al. |
| 7,141,129 | B2 | 11/2006 | Smyth et al. |
| 7,148,459 | B2 | 12/2006 | Williford et al. |
| 7,170,461 | B2 | 1/2007 | Parsche |
| 7,173,577 | B2 | 2/2007 | Brown et al. |
| 7,184,629 | B2 | 2/2007 | Montgomery et al. |
| 7,187,326 | B2 | 3/2007 | Beadle et al. |
| 7,187,340 | B2 | 3/2007 | Kralovec et al. |
| 7,187,827 | B2 | 3/2007 | Montgomery et al. |
| 7,188,473 | B1 | 3/2007 | Asada et al. |
| 7,190,860 | B2 | 3/2007 | Montgomery et al. |
| 7,205,949 | B2 | 4/2007 | Turner |
| 7,216,282 | B2 | 5/2007 | Cain |
| 7,221,181 | B2 | 5/2007 | Chao et al. |
| 7,221,322 | B1 | 5/2007 | Durham et al. |
| 7,224,866 | B2 | 5/2007 | Montgomery et al. |
| 7,236,679 | B2 | 6/2007 | Montgomery et al. |
| 7,242,327 | B1 | 7/2007 | Thompson |
| 7,255,535 | B2 | 8/2007 | Albrecht et al. |
| 7,285,000 | B2 | 10/2007 | Pleskach et al. |
| 7,286,734 | B2 | 10/2007 | Montgomery et al. |
| 7,292,640 | B2 | 11/2007 | Nieto et al. |
| 7,293,054 | B2 | 11/2007 | Clements et al. |
| 7,299,038 | B2 | 11/2007 | Kennedy et al. |
| 7,302,185 | B2 | 11/2007 | Wood et al. |
| 7,304,609 | B2 | 12/2007 | Roberts |
| 7,304,972 | B2 | 12/2007 | Cain et al. |
| 7,321,298 | B2 | 1/2008 | Judkins et al. |
| 7,321,777 | B2 | 1/2008 | Billhartz et al. |
| 7,328,012 | B2 | 2/2008 | Ziarno et al. |
| 7,333,057 | B2 | 2/2008 | Snyder |
| 7,333,458 | B2 | 2/2008 | Cain |
| 7,336,242 | B2 | 2/2008 | Phelan et al. |
| 7,342,801 | B2 | 3/2008 | Jandzio et al. |
| 7,346,241 | B2 | 3/2008 | Montgomery et al. |
| 7,348,929 | B2 | 3/2008 | Phelan et al. |
| 7,358,921 | B2 | 4/2008 | Snyder et al. |
| 7,369,819 | B2 | 5/2008 | Luu |
| 7,372,423 | B2 | 5/2008 | Packer et al. |
| 7,382,765 | B2 | 6/2008 | Kennedy et al. |
| 7,392,229 | B2 | 6/2008 | Harris et al. |
| 7,394,826 | B2 | 7/2008 | Cain et al. |
| 7,408,519 | B2 | 8/2008 | Durham et al. |
| 7,408,520 | B2 | 8/2008 | Durham et al. |
| 7,409,240 | B1 | 8/2008 | Bishop |
| 7,414,424 | B2 | 8/2008 | Chao et al. |
| 7,415,178 | B2 | 8/2008 | Montgomery et al. |
| 7,415,335 | B2 | 8/2008 | Bell et al. |
| RE40,479 | E | 9/2008 | Wright et al. |
| 7,420,519 | B2 | 9/2008 | Durham et al. |
| 7,424,187 | B2 | 9/2008 | Montgomery et al. |
| 7,426,387 | B2 | 9/2008 | Wright et al. |
| 7,426,388 | B1 | 9/2008 | Wright et al. |
| 7,428,412 | B2 | 9/2008 | Wright et al. |
| 7,433,392 | B2 | 10/2008 | Nieto et al. |
| 7,433,430 | B2 | 10/2008 | Wadsworth et al. |
| 7,444,146 | B1 | 10/2008 | Wright et al. |
| 7,453,409 | B2 | 11/2008 | Zimmerman et al. |
| 7,453,414 | B2 | 11/2008 | Parsche |
| 7,453,864 | B2 | 11/2008 | Kennedy et al. |
| 7,456,756 | B2 | 11/2008 | Ziarno |
| 7,463,210 | B2 | 12/2008 | Rawnick et al. |
| 7,468,954 | B2 | 12/2008 | Sherman |
| 7,469,047 | B2 | 12/2008 | Judkins et al. |
| 7,479,604 | B1 | 1/2009 | Smith et al. |
| 7,487,131 | B2 | 2/2009 | Harris et al. |
| 7,496,384 | B2 * | 2/2009 | Seto et al. .................. 455/562.1 |
| 7,499,287 | B2 | 3/2009 | Jandzio et al. |
| 7,499,515 | B1 | 3/2009 | Beadle |
| 7,505,009 | B2 | 3/2009 | Parsche et al. |
| 7,518,372 | B2 | 4/2009 | Schilling et al. |
| 7,518,779 | B2 | 4/2009 | Wasilousky |
| 7,526,022 | B2 | 4/2009 | Nieto |
| 7,528,844 | B2 | 5/2009 | Deschamp |
| 7,538,929 | B2 | 5/2009 | Wasilousky |
| 7,546,123 | B2 | 6/2009 | Wright et al. |
| 7,554,499 | B2 | 6/2009 | Munk et al. |
| 7,555,064 | B2 | 6/2009 | Beadle |
| 7,555,131 | B2 | 6/2009 | Hollowbush et al. |
| 7,555,179 | B2 | 6/2009 | Montgomery et al. |
| 7,557,702 | B2 | 7/2009 | Eryurek et al. |
| 7,561,024 | B2 | 7/2009 | Rudnick |
| 7,567,256 | B2 | 7/2009 | Hollowbush et al. |
| 7,570,713 | B2 | 8/2009 | Jao et al. |
| 7,573,431 | B2 | 8/2009 | Parsche |
| 7,577,899 | B2 | 8/2009 | Nieto et al. |
| 7,583,950 | B2 | 9/2009 | Russell et al. |
| 7,593,488 | B2 | 9/2009 | Furman et al. |
| 7,593,641 | B2 | 9/2009 | Tegge, Jr. |
| 7,595,739 | B2 | 9/2009 | Ziarno |
| 7,598,918 | B2 | 10/2009 | Durham et al. |
| 7,603,612 | B2 | 10/2009 | Nieto |
| 7,607,223 | B2 | 10/2009 | Pleskach et al. |
| 7,620,374 | B2 | 11/2009 | Ziarno et al. |
| 7,620,881 | B2 | 11/2009 | Nieto |
| 7,623,833 | B2 | 11/2009 | Cabrera et al. |
| 7,627,803 | B2 | 12/2009 | Nieto et al. |
| 7,631,243 | B2 | 12/2009 | Nieto |
| 7,649,421 | B2 | 1/2010 | Victor |
| 7,649,951 | B2 | 1/2010 | Moffatt |
| 7,657,825 | B2 | 2/2010 | Norris et al. |
| 7,667,888 | B2 | 2/2010 | Wasilousky |
| 7,676,205 | B2 | 3/2010 | Moffatt et al. |
| 7,676,736 | B2 | 3/2010 | Norris et al. |
| 7,688,138 | B2 | 3/2010 | Hehn |
| 7,729,336 | B2 | 6/2010 | Pun et al. |
| 7,733,667 | B2 | 6/2010 | Qin et al. |
| 7,738,548 | B2 | 6/2010 | Roberts et al. |
| 7,750,861 | B2 | 7/2010 | Delgado et al. |
| 7,751,488 | B2 | 7/2010 | Moffatt |
| 7,755,512 | B2 | 7/2010 | Ziarno |
| 7,755,553 | B2 | 7/2010 | Packer et al. |
| 7,756,134 | B2 | 7/2010 | Smith et al. |
| 7,761,009 | B2 | 7/2010 | Bloom |
| 7,769,028 | B2 | 8/2010 | Boley et al. |
| 7,769,376 | B2 | 8/2010 | Wright et al. |
| 7,778,651 | B2 | 8/2010 | Billhartz |
| 7,782,398 | B2 | 8/2010 | Chan et al. |
| 7,782,978 | B2 | 8/2010 | Mattsson |
| 7,788,219 | B2 | 8/2010 | Harris |
| 7,808,441 | B2 | 10/2010 | Parsche et al. |
| 7,809,410 | B2 | 10/2010 | Palum et al. |
| 7,813,408 | B2 | 10/2010 | Nieto et al. |
| 7,813,433 | B2 | 10/2010 | Moffatt |
| 7,831,154 | B2 | 11/2010 | Alwan et al. |
| 7,831,892 | B2 | 11/2010 | Norris et al. |
| 7,831,893 | B2 | 11/2010 | Norris et al. |
| 7,840,199 | B2 * | 11/2010 | Krishnaswamy et al. .... 455/147 |
| 7,855,681 | B2 | 12/2010 | Minear et al. |
| 7,855,997 | B2 | 12/2010 | Adams et al. |
| 7,856,012 | B2 | 12/2010 | Smith et al. |
| 7,860,147 | B2 | 12/2010 | Moffatt |
| 7,860,200 | B2 | 12/2010 | Furman et al. |
| 7,864,835 | B2 | 1/2011 | Furman et al. |
| 7,869,828 | B2 * | 1/2011 | Wang et al. .................. 455/561 |
| 7,877,209 | B2 | 1/2011 | Harris et al. |
| 7,880,722 | B2 | 2/2011 | Harris |
| 7,894,509 | B2 | 2/2011 | Smith et al. |
| 7,903,749 | B2 | 3/2011 | Moffatt |

| | | | | | |
|---|---|---|---|---|---|
| 7,907,417 B2 | 3/2011 | Jandzio et al. | 7,990,860 B2 | 8/2011 | Smith et al. |
| 7,911,385 B2 | 3/2011 | Heuser | 7,995,678 B2 | 8/2011 | Norris et al. |
| 7,921,145 B2 | 4/2011 | Michaels | 7,995,749 B2 | 8/2011 | Michaels |
| 7,937,427 B2 | 5/2011 | Chester et al. | 2009/0104885 A1* | 4/2009 | Asayama et al. ............ 455/296 |
| 7,969,358 B2 | 6/2011 | Martin et al. | | | |
| 7,970,365 B2 | 6/2011 | Martin et al. | | | |

\* cited by examiner

FIG. 1 – prior art

APPARATUS, SYSTEM, AND METHOD FOR INTEGRATED PHASE SHIFTING AND AMPLITUDE CONTROL OF PHASED ARRAY SIGNALS

CROSS-REFERENCES TO RELATED APPLICATIONS

This application claims the benefit of U.S. Provisional Patent Application No. 61/080,965 entitled "Apparatus, System, and Method for Integrated Phase Shifting and Amplitude Control of Phased Array Signals" and filed on Jul. 15, 2008 for Karl F. Warnick, which is incorporated herein by reference.

BACKGROUND

1. Field of the Invention

This invention relates to phased arrays and more particularly relates to phase/amplitude control.

2. Description of the Related Art

Phased array systems employ an array of antennas to permit directional signal reception and/or transmission. The array may be one-, two-, or three-dimensional. Arrays operate on a principle similar to that of a diffraction grating, in which the constructive and destructive interference of evenly spaced waveforms cause a signal of interest arriving from one angular direction to be strengthened, while signals from other angular directions are attenuated. By separately controlling the phase and the amplitude of the signal at each antenna of the phased array, the angular direction of travel of the signal of interest may be selectively enhanced and undesired signals may be excluded.

For example, consider a simple linear array of antennas spaced evenly a distance d apart, receiving/transmitting a signal of wavelength $\lambda$ at an angle $\theta$ from the vertical. The time of arrival of the signal to/from each antenna will be successively delayed, manifesting itself as a phase shift of $(2\pi d/\lambda)\sin\theta$ modulo $2\pi$. By incrementally shifting the phase of the signal to/from each successive antenna by that amount, the combined signal to/from the array will be strengthened in the direction of angle $\theta$.

Existing circuitry to shift the phase of a radio frequency ("RF") signal by a variable amount is expensive, bulky, and not well-suited to integration on a chip. Because the circuitry must be replicated for each antenna in the phased array, the overall system cost becomes prohibitive for many applications.

Another problem is that phase shifting alone may not be sufficient to isolate the signal of interest. Selective amplitude control at each antenna may also be required, adding the cost of a wideband variable gain amplifier to each antenna branch. Amplitude control enables array pattern sidelobe control, which allows further reduction of interference with other undesired transmitters or receivers relative to phase-only beamforming.

SUMMARY

From the foregoing discussion, it should be apparent that a long-felt unmet need exists for an apparatus, system, and method that simplifies and reduces the cost of amplitude control and phase shift circuitry in phased array receivers and transmitters. Beneficially, such an apparatus, system, and method would lend itself to chip-level integration using standard circuit elements.

The present invention has been developed in response to the present state of the art, and in particular, in response to the problems and needs in the art that have proven intractable for low cost phased array antennas under currently available variable amplitude and phase shifters. Accordingly, the present invention has been developed to provide an apparatus, system, and method for phase shifting and amplitude control that overcome many or all of the above-discussed shortcomings in the art.

The internal circuitry of a typical receiver/transmitter operates at an intermediate frequency ("IF") which is lower than the radio frequency ("RF") of the antenna. Such a receiver/transmitter thus includes a mixer to downconvert/upconvert the RF/IF signal to an IF/RF signal by mixing it with a local oscillator ("LO") signal of a fixed frequency, and a filter to isolate the desired frequency band.

The present invention exploits the fact that the mixer not only converts the frequency of the RF/IF signal, but also exhibits the useful side-effect of applying the phase and the amplitude of the LO signal to the RF/IF signal with which it is mixed. Thus a variable phase and amplitude shifter may be used with the LO signal instead of shifting the RF/IF signal in each branch of the phased array system. Unlike the RF/IF signal, the LO signal is a pure sinusoidal signal of one fixed frequency, thus allowing a much simpler variable phase and amplitude shifter to be used. The frequency plan can also be designed so that the LO frequency is lower than the RF frequency, which further simplifies the circuitry required to shift the phase of the LO signal. In some applications, it may also be desirable to allow for a tunable LO signal, which would require a modest increase in the complexity of the phase shifter but the other advantages of the present invention would remain.

The apparatus to process phased array signals is provided with a plurality of modules including a two-phase local oscillator, a signal generator, and a mixer. The apparatus includes a two-phase local oscillator, in one embodiment, that generates an in-phase sinusoidal signal of a fixed frequency and a quadrature sinusoidal signal of the fixed frequency having a ninety degree phase shift from the in-phase sinusoidal signal. A signal generator, in one embodiment, receives the in-phase sinusoidal signal and the quadrature sinusoidal signal and generates a controllable sinusoidal signal of the fixed frequency. The controllable sinusoidal signal, in one embodiment, includes a shiftable phase. In another embodiment, the controllable sinusoidal signal also includes a variable amplitude. A mixer, in another embodiment, varies an amplitude and shifts a phase of an input signal by mixing the input signal with the controllable sinusoidal signal to generate an output signal. The input signal and the output signal carry phase and amplitude information required for phased array signal processing.

In a further embodiment, the signal generator may include an in-phase variable gain amplifier that amplifies the in-phase sinusoidal signal in response to an in-phase control voltage to yield an in-phase amplified sinusoidal signal. The signal generator may include a quadrature variable gain amplifier that amplifies the quadrature sinusoidal signal in response to a quadrature control voltage to yield a quadrature amplified sinusoidal signal. The generator may also include a combiner that adds the in-phase amplified sinusoidal signal to the quadrature amplified sinusoidal signal to yield the controllable sinusoidal signal.

In another embodiment, the two-phase local oscillator may further include a local oscillator that generates a sinusoidal signal of the fixed frequency, a splitter that splits the sinusoidal signal into the in-phase sinusoidal signal and a copy of the in-phase sinusoidal signal, and/or a passive fixed phase shifter that shifts the copy of the in-phase sinusoidal signal by ninety degrees to yield the quadrature sinusoidal signal.

The apparatus, in one embodiment, is a transmitter, where the output signal is a radio frequency signal to an antenna of the phased array. In another embodiment, the apparatus is a receiver, where the input signal is a radio frequency signal from an antenna of the phased array.

The mixer, in one embodiment, incorporates a first stage frequency downconversion to yield an intermediate frequency signal as the output signal of the receiver. In a further embodiment, the controllable sinusoidal signal further comprises a variable amplitude and the downconversion may be low-IF in that the fixed frequency is approximately equal to a carrier frequency of the radio frequency signal. In such an embodiment, the apparatus may also include a quadrature mixer that varies the amplitude and shift the phase of the input signal by mixing it with a quadrature controllable sinusoidal signal to generate a quadrature output signal. In another embodiment, the downconversion is direct in that the fixed frequency is equal to the carrier frequency. In yet another embodiment, the fixed frequency is tunable.

In an embodiment, the apparatus includes a filter that removes spurious mixing products from the output signal to yield a filtered output signal. In a further embodiment, the apparatus includes an amplifier that compensates for conversion loss by amplifying the filtered output signal to yield an amplified output signal.

A system of the present invention is also presented to process phased array signals. The system may be embodied by a two-phase local oscillator, a plurality of signal generators, a plurality of mixers, a plurality of low-noise amplifiers, a combiner, an analog-to-digital converter and a digital signal processor. The two-phase local oscillator generates an in-phase sinusoidal signal of a fixed frequency and a quadrature sinusoidal signal of the fixed frequency having a ninety degree phase shift from the in-phase sinusoidal signal. The plurality of signal generators respectively generate a plurality of controllable sinusoidal signals of the fixed frequency, of a variable amplitude, and of a shiftable phase, from the in-phase sinusoidal signal and the quadrature sinusoidal signal, in response to a plurality of in-phase control voltages and a plurality of quadrature control voltages.

The plurality of mixers respectively vary the amplitude and shift the phase of a plurality of input signals by mixing them with the plurality of controllable sinusoidal signals from the plurality of signal generators to generate a plurality of output signals. The plurality of low noise amplifiers respectively amplify a plurality of radio frequency signals from a plurality of antennas of a phased array to yield the plurality of input signals. The combiner combines the plurality of output signals to yield a combined output signal and a copy of the combined output signal. The analog-to-digital converter converts the copy of the combined output signal to a digital output signal. The digital signal processor algorithmically determines and provides the plurality of in-phase control voltages and the plurality of quadrature control voltages to the plurality of signal generators.

In one embodiment, the plurality of signal generators, the plurality of mixers, and the combiner are integrated onto a chip. In a further embodiment, the two-phase local oscillator is also integrated onto the chip. In another embodiment, the plurality of low noise amplifiers is also integrated onto the chip.

The system, in a further embodiment, includes a digital to analog converter integrated onto the chip that generates the plurality of in-phase control voltages and the plurality of quadrature control voltages from a digital control signal generated by the digital signal processor. In another further embodiment, the chip is partitioned into a plurality of identical chips yielding a plurality of partitioned combined output signals, and the system also includes a second stage combiner that combines the plurality of partitioned combined output signals into the combined output signal.

A method of the present invention is also presented for processing phased array signals. The method in the disclosed embodiments substantially includes the steps necessary to carry out the functions presented above with respect to the operation of the described apparatus and system.

The method, in one embodiment, includes generating an in-phase sinusoidal signal of a fixed frequency and a quadrature sinusoidal signal of the fixed frequency having a ninety degree phase shift from the in-phase sinusoidal signal. The method, in one embodiment, includes amplifying the in-phase sinusoidal signal in response to an in-phase control voltage to yield an in-phase amplified sinusoidal signal. The method, in one embodiment, includes amplifying the quadrature sinusoidal signal in response to a quadrature control voltage to yield a quadrature amplified sinusoidal signal. The method, in one embodiment, includes adding the in-phase amplified sinusoidal signal to the quadrature amplified sinusoidal signal to yield a controllable sinusoidal signal. The method, in one embodiment, includes mixing an input signal with the controllable sinusoidal signal to generate an output signal having an amplitude modulation and a phase shift with respect to the input signal as dictated by the in-phase control voltage and the quadrature control voltage.

The input signal and the output signal carry phase and amplitude information required for phased array signal processing. The method, in an embodiment, includes phased array signal transmission where the output signal is a radio frequency signal to an antenna of the phased array. In another embodiment, the method includes phased array signal reception where the input signal is a radio frequency signal from an antenna of the phased array.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussion of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize that the invention may be practiced without one or more of the specific features or advantages of a particular embodiment. In other instances, additional features and advantages may be recognized in certain embodiments that may not be present in all embodiments of the invention.

These features and advantages of the present invention will become more fully apparent from the following description and appended claims, or may be learned by the practice of the invention as set forth hereinafter.

BRIEF DESCRIPTION OF THE DRAWINGS

In order that the advantages of the invention will be readily understood, a more particular description of the invention briefly described above will be rendered by reference to specific embodiments that are illustrated in the appended drawings. Understanding that these drawings depict only typical embodiments of the invention and are not therefore to be considered to be limiting of its scope, the invention will be described and explained with additional specificity and detail through the use of the accompanying drawings, in which.

DETAILED DESCRIPTION

Reference throughout this specification to "one embodiment," "an embodiment," or similar language means that a particular feature, structure, or characteristic described in connection with the embodiment is included in at least one embodiment of the present invention. Thus, appearances of the phrases "in one embodiment," "in an embodiment," and similar language throughout this specification may, but do not necessarily, all refer to the same embodiment.

Furthermore, the described features, structures, or characteristics of the invention may be combined in any suitable manner in one or more embodiments. In the following description, numerous specific details are provided, such as examples of programming, software modules, user selections, network transactions, database queries, database structures, hardware modules, hardware circuits, hardware chips, etc., to provide a thorough understanding of embodiments of the invention. One skilled in the relevant art will recognize, however, that the invention may be practiced without one or more of the specific details, or with other methods, components, materials, and so forth. In other instances, well-known structures, materials, or operations are not shown or described in detail to avoid obscuring aspects of the invention.

The schematic flow chart diagrams included herein are generally set forth as logical flow chart diagrams. As such, the depicted order and labeled steps are indicative of one embodiment of the presented method. Other steps and methods may be conceived that are equivalent in function, logic, or effect to one or more steps, or portions thereof, of the illustrated method. Additionally, the format and symbols employed are provided to explain the logical steps of the method and are understood not to limit the scope of the method. Although various arrow types and line types may be employed in the flow chart diagrams, they are understood not to limit the scope of the corresponding method. Indeed, some arrows or other connectors may be used to indicate only the logical flow of the method. For instance, an arrow may indicate a waiting or monitoring period of unspecified duration between enumerated steps of the depicted method. Additionally, the order in which a particular method occurs may or may not strictly adhere to the order of the corresponding steps shown.

Figure 1:
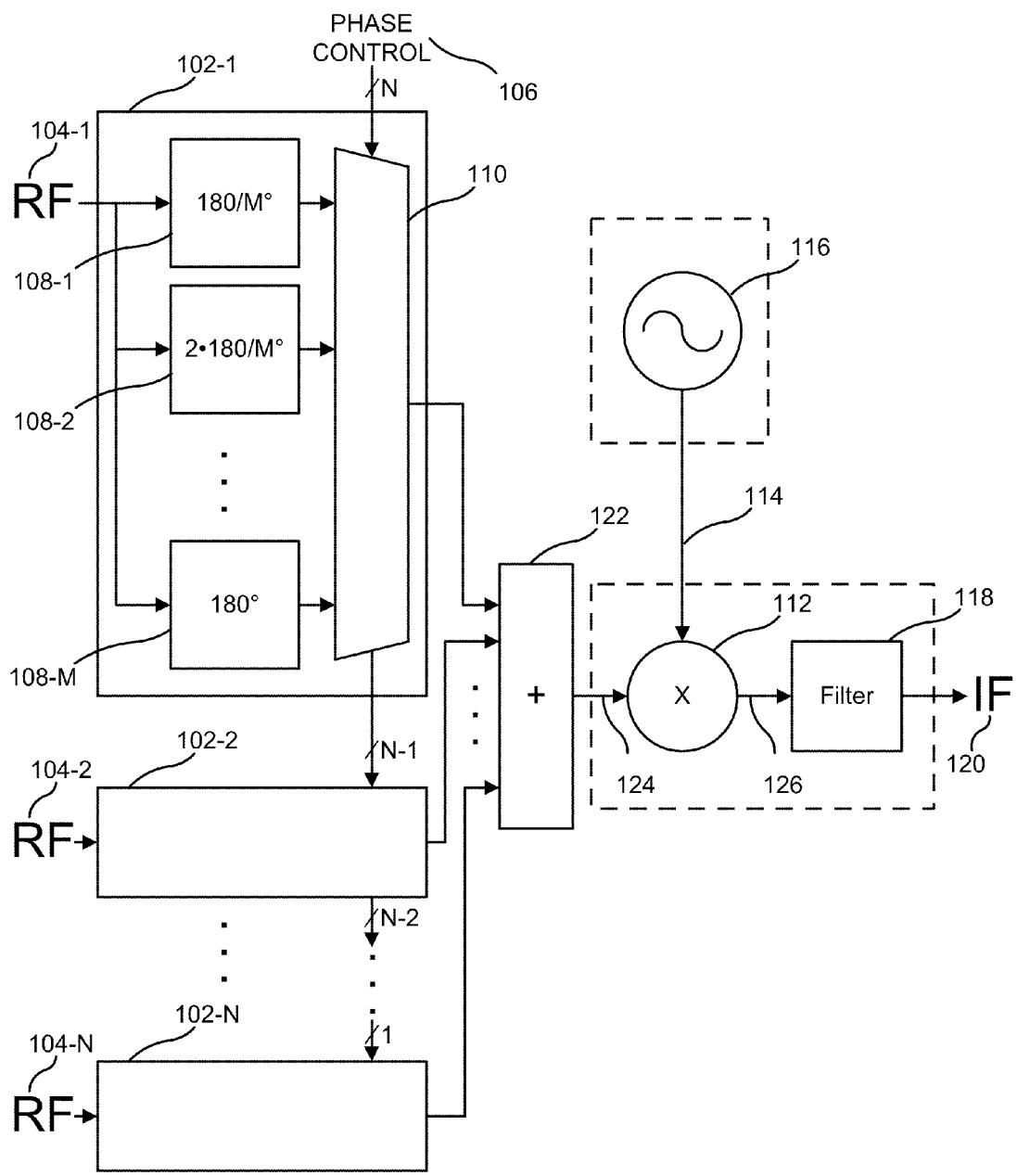
FIG. 1 is a schematic block diagram of a variable phase shifter according to the prior art, with the variable phase shifter depicted in the context of a beamforming network and RF to IF frequency downconverter.

FIG. 1 is a schematic block diagram of a variable phase shifter 102 according to the prior art, to shift the phase of an incoming RF signal 104 by an amount specified by a phase control signal 106. The variable phase shifter 102 is conceptually comprised of a plurality of fixed phase shifters 108, not to be confused with the plurality of variable phase shifters 102-1 through 102-N corresponding to the plurality of antennas comprising a phased array. For example, fixed phase shifter 108-1 shifts RF signal 104 by 180/M degrees, fixed phase shifter 108-2 shifts RF signal 104 by 2·180/M degrees, and fixed phase shifter 108-M shifts RF signal 104 by 180 degrees. A selector 110 then selects the output of the fixed phase shifter 108 as designated by the phase control signal 106. As can be seen, a major disadvantage of this approach is that numerous fixed phase shifters 108 must be provided in order to implement just one variable phase shifter 102, which in turn must be replicated for each antenna branch of the phased array. The variable phase shifter 102 maybe either analog or digital, although in the analog case the fixed phase shifters 108 may conceptually approach a continuum of infinitesimally distinct phase shift values as M tends toward infinity.

Completely independent of the phase shifting function, the resulting phase-shifted RF signal 124 from a combiner 122 feeds into a mixer 112 and is mixed with a sinusoidal signal of fixed frequency 114 and phase from a local oscillator 116 in order to downconvert the RF signal to a lower carrier frequency. Unwanted spurious byproduct frequencies from the mixer 112 are removed by a filter 118, yielding the desired IF signal 120. To mathematically characterize the foregoing operation, a simple RF signal 104 maybe used as expressed by the following equation, where $\alpha$ is the carrier frequency and t is time:

$$\sin(\alpha t) \tag{1}$$

The phase-shifted RF signal 124 then becomes:

$$\sin(\alpha t - \phi) \tag{2}$$

where $\phi$ is the desired phase shift. The sinusoidal signal of fixed frequency 114 may be expressed by the following equation, where $\omega$ is the fixed frequency:

$$\cos(\omega) \tag{3}$$

The mixer 112 yields a mixer output signal 126 as the product of Equation 2 and 3:

$$\tfrac{1}{2}(\sin((\alpha+\omega)t-\phi)+\sin((\alpha-\omega)t-\phi)) \tag{4}$$

where $\alpha+\omega$ is the upconverted frequency and $\alpha-\omega$ is the downconverted frequency, and for simplicity the conversion loss of the mixer is ignored. The filter 118 removes the upconverted frequency, leaving the following as the downconverted IF signal 120:

$$\tfrac{1}{2}\sin((\alpha-\omega)t-\phi) \tag{5}$$

where the insertion loss of the filter is assumed to be negligible. The amplitude of the signal is modified by fixed scaling due to the mixer conversion loss and filter loss, but there exists no means for controlling the amplitude. Note that the phase shift φ has been preserved through the frequency downconversion.

Figure 2:
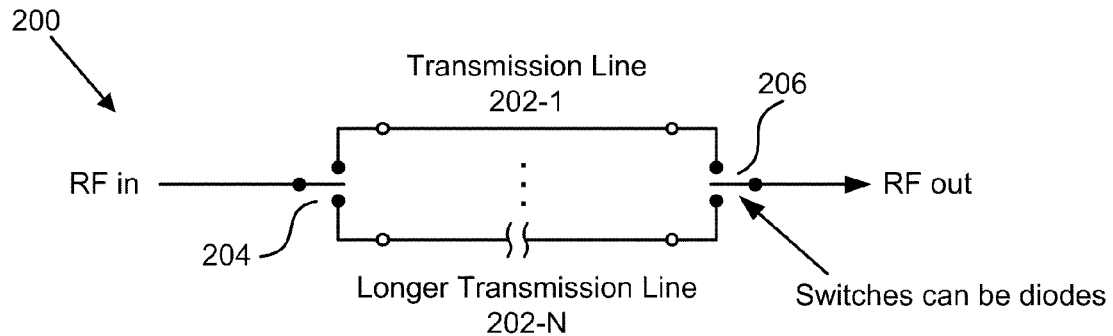
FIG. 2 is schematic block diagram of a digital switched transmission line variable phase shifter.

FIG. 2 is schematic block diagram of a digital switched transmission line variable phase shifter 200, as one embodiment of the variable phase shifter 102. Transmission lines 202 of varying length implement the fixed phase shifters 108. An input switch 204 and an output switch 206 together perform the function of the selector 110. In another embodiment, the switches 204 and 206 may be diodes. The length and number of the transmission line(s) 202 required make these embodiments very difficult to integrate on-chip.

Figure 3:
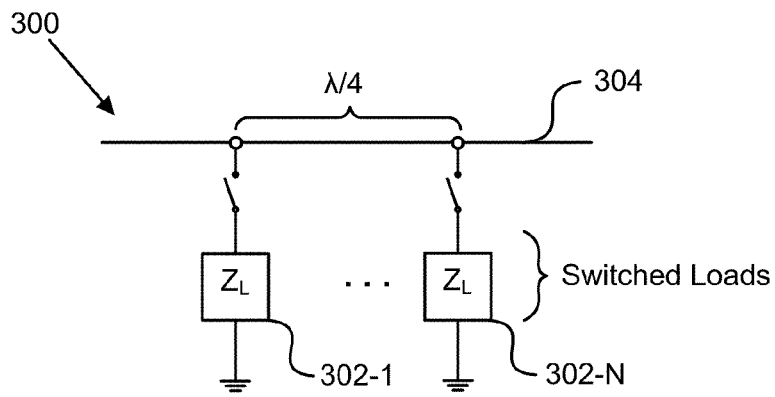
FIG. 3 is a schematic block diagram of a digital loaded transmission line variable phase shifter.

FIG. 3 is a schematic block diagram of a digital loaded transmission line variable phase shifter 300, as another embodiment of the variable phase shifter 102. Switched loads 302 are evenly distributed along a transmission line 304, comprising the fixed phase shifters 108. The phase shift may be increased by successively connecting the switched loads 302 onto the transmission line 304 using their switching capability to perform the function of the selector 110. Although the transmission line 304 is shorter than the transmission line(s) 202, the size and number of loads make this embodiment very expensive in terms of chip area.

Other digital embodiments not shown include reflection phase shifters comprising switched loads on a quadrature coupler, and switched capacitors. These embodiments suffer from a high transistor count and large devices requiring significant chip area.

Figure 4:
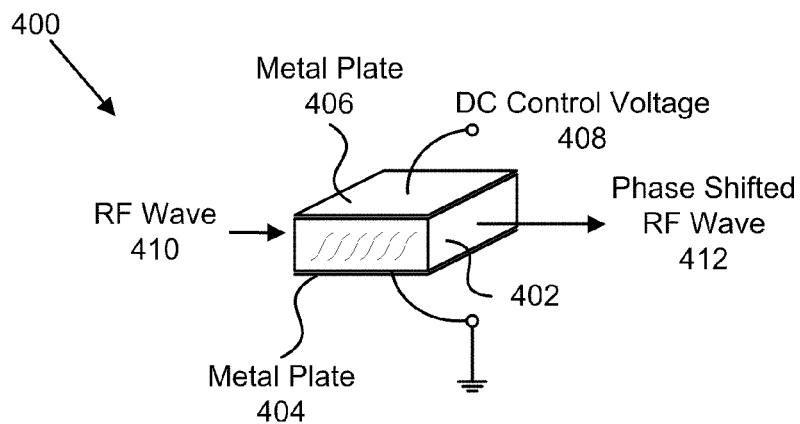
FIG. 4 is a schematic block diagram of an analog ferroelectric variable phase shifter.

FIG. 4 is a schematic block diagram of an analog ferroelectric variable phase shifter 400, as yet another embodiment of the variable phase shifter 102. A non-linear dielectric 402, such as barium strontium titanate, is sandwiched between a grounded metal plate 404 and a variable potential metal plate 406 to perform the function of the selector 110. A potential is applied to the metal plate 406 by a DC control voltage 408 which acts as the phase control signal 106. The ferroelectric property of the non-linear dielectric 402 effectively performs the function of the fixed phase shifters 108, shifting the input RF signal 410 to yield the phase-shifted output RF signal 412. In another embodiment, varactor diodes which change capacitance with the applied DC control voltage 408 may be used. In yet another embodiment, PIN diodes may be used. None of these analog embodiments of the variable phase shifter 102 are very suitable for on-chip integration, in particular because the prior art phased array solution, as depicted in FIG. 1, requires numerous variable phase shifters 102.

Figure 5:
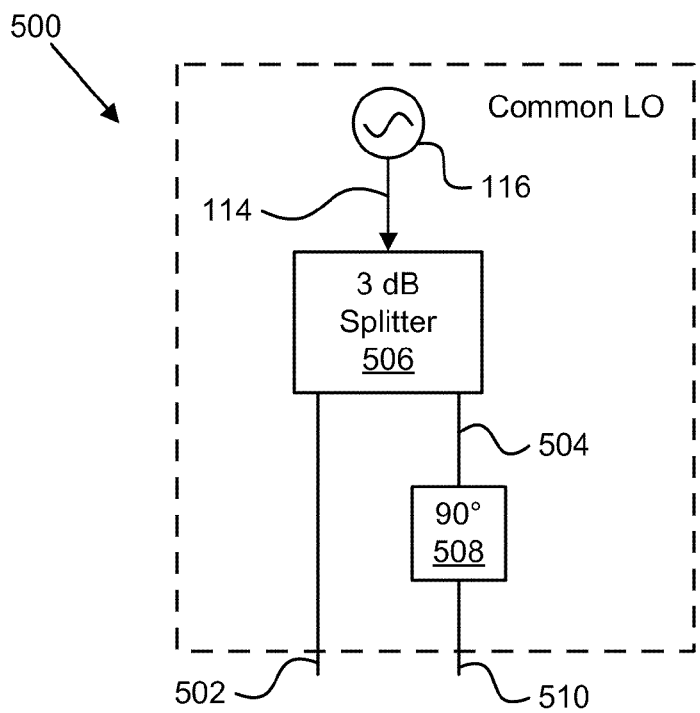
FIG. 5 is a schematic block diagram of a two-phase local oscillator in accordance with the present invention.

FIG. 5 is a schematic block diagram of a two-phase local oscillator 500 in accordance with the present invention. The two-phase oscillator 500 may be used with the phased array of the present invention. The local oscillator 116 provides the sinusoidal signal of fixed frequency 114 which is split into an in-phase sinusoidal signal 502 and a copy of the in-phase sinusoidal signal 504 by a splitter 506. A passive fixed phase shifter 508 shifts the copy of the in-phase sinusoidal signal 504 by ninety degrees to yield a quadrature sinusoidal signal 510. Very little additional circuitry is required to incorporate the splitter 506 and the passive fixed phase shifter 508 with the local oscillator 116. In the illustrated embodiment, a 3 dB splitter is shown, such that the in-phase sinusoidal signal 502 and the copy of the in-phase sinusoidal signal 504 are made equal in strength. In an embodiment, only one splitter is needed for the entire array. Any standard splitter as known in the art may be used. Any standard oscillator may also be used.

To mathematically characterize the two-phase local oscillator 500, the sinusoidal signal of fixed frequency 114 may be expressed by the following equation, where ω is the fixed frequency:

$$\sin(\omega t) \quad (6)$$

Equation 6 also represents the in-phase sinusoidal signal 502 and the copy of the in-phase sinusoidal signal 504. The quadrature sinusoidal signal 510 is obtained by shifting the phase of Equation 6, a sine function, by ninety degrees, thus yielding a cosine function as follows:

$$\cos(\omega t) \quad (7)$$

Both output phases of the two-phase local oscillator 500 are thus characterized.

Figure 6:
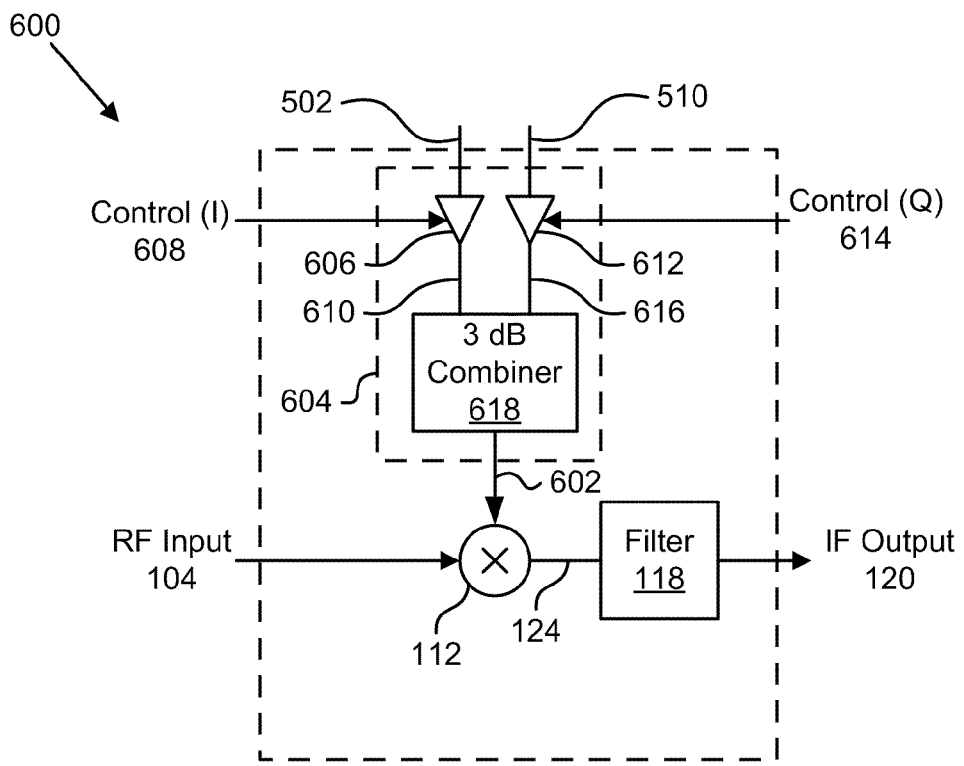
FIG. 6 is a schematic block diagram of a variable amplitude and phase shifter according to the present invention.

FIG. 6 is a schematic block diagram of a variable amplitude and phase shifter 600 according to the present invention. The variable amplitude and phase shifter 600 may be used with the phased array of the present invention. Rather than requiring a large and expensive variable phase shifter 102, the RF signal 104 is fed directly into the mixer 112. In this design, the mixer 112 not only performs frequency downconversion, but simultaneously accomplishes the variable phase shifting of the RF signal, and additionally performs amplitude control, without requiring any additional circuitry in the mixer 112 itself. Rather, the phase shift and amplitude control information is provided via a controllable sinusoidal signal 602 having the same fixed frequency as the local oscillator 116, a variable amplitude, and a shiftable phase.

The controllable sinusoidal signal 602 is generated by a comparatively simple signal generator 604. A first variable gain amplifier 606 amplifies the in-phase sinusoidal signal 502 in response to a first control voltage 608 to yield an in-phase amplified sinusoidal signal 610. A second variable gain amplifier 612 amplifies the quadrature sinusoidal signal 510 in response to a second control voltage 614 to yield a quadrature amplified sinusoidal signal 616. Lastly, a combiner 618 adds the in-phase amplified sinusoidal signal 610 to the quadrature amplified sinusoidal signal 616 to yield the controllable sinusoidal signal 602. The "first" and "second" amplifiers 606 and 612 with control voltages 608 and 614, while functionally the same, shall hereinafter be denoted as "in-phase" and "quadrature" respectively, reflecting their use in conjunction with the in-phase and quadrature sinusoidal signals 610 and 616.

To mathematically characterize the variable amplitude and phase shifter 600, the in-phase control voltage 608 may be expressed by the following equation, where A is the desired amplitude and φ is the desired phase shift:

$$A \sin(\phi) \quad (8)$$

The quadrature control voltage 614 may be similarly expressed as follows:

$$A \cos(\phi) \quad (9)$$

Note that the time variable t is not present in Equations 8 and 9, since they represent DC voltages that may be held constant as appropriate so as to specify A and φ. The equation for the in-phase amplified sinusoidal signal 610 may be obtained by simply multiplying Equation 8 by Equation 6:

$$A \sin(\phi)\sin(\omega t) \quad (10)$$

In the same fashion, the equation for the quadrature amplified sinusoidal signal 616 may be obtained by simply multiplying Equation 9 by Equation 7:

$$A \cos(\phi)\cos(\omega t) \quad (11)$$

The action of combiner 618 may be represented by adding Equation 10 and Equation 11 and simplifying the resulting expression to obtain the following equation for the controllable sinusoidal signal 602:

$$A\cos(\omega t+\phi) \quad (11)$$

The controllable sinusoidal signal 602 thus generated by the variable amplitude and phase shifter 600 feeds into the mixer 112 and is mixed with the RF signal 104 in order to downconvert it to a lower carrier frequency. Unwanted spurious byproduct frequencies from the mixer 112 are removed by the filter 118, yielding the desired IF signal 120. To mathematically characterize the foregoing operation, a simple RF signal 104 maybe used as expressed by Equation 1. The mixer 112 yields a mixer output signal 126 as the product of Equations 1 and 11:

$$\tfrac{1}{2}A((\sin((\alpha+\omega)t+\phi)+\sin((\alpha-\omega)t-\phi))) \quad (12)$$

where α+ω is the upconverted frequency and α−ω is the downconverted frequency, and the amplitude scaling associated with the mixer conversion loss has been ignored. The filter 118 removes the upconverted frequency, leaving the following as the downconverted IF signal 120:

$$\tfrac{1}{2}A\sin((\alpha-\omega)t-\phi) \quad (13)$$

Note that the amplitude control A and the phase shift (p have been preserved through the frequency downconversion. The resulting expression for the IF signal 120 produced by the present invention, as represented by Equation 13, is the same as the expression for the IF signal 120 produced by the prior art mechanism, as represented by Equation 5. The only difference between Equation 13 and Equation 5 is the inclusion of the amplitude control A, representing a further enhancement which may be provided by the present invention. In order to transfer the amplitude A of the controllable sinusoidal signal 602 to the downconverted IF signal 120, a true nonlinear mixer, as opposed to a switching mixer, is typically required. For applications requiring only phase control, it will be obvious to one skilled in the art that the invention can be reduced and simplified so that only the phase of the controllable signal 602 is transferred to the downconverted IF signal 120, in which case a switching mixer can be used. For this reduced, phase-only embodiment, it is possible to simplify the signal generator 604 so that only one variable gain amplifier is required. While the mixer and filter combination described here perform a frequency downconversion, it is also possible with obvious modifications to perform an upconversion if desired.

Figure 10:
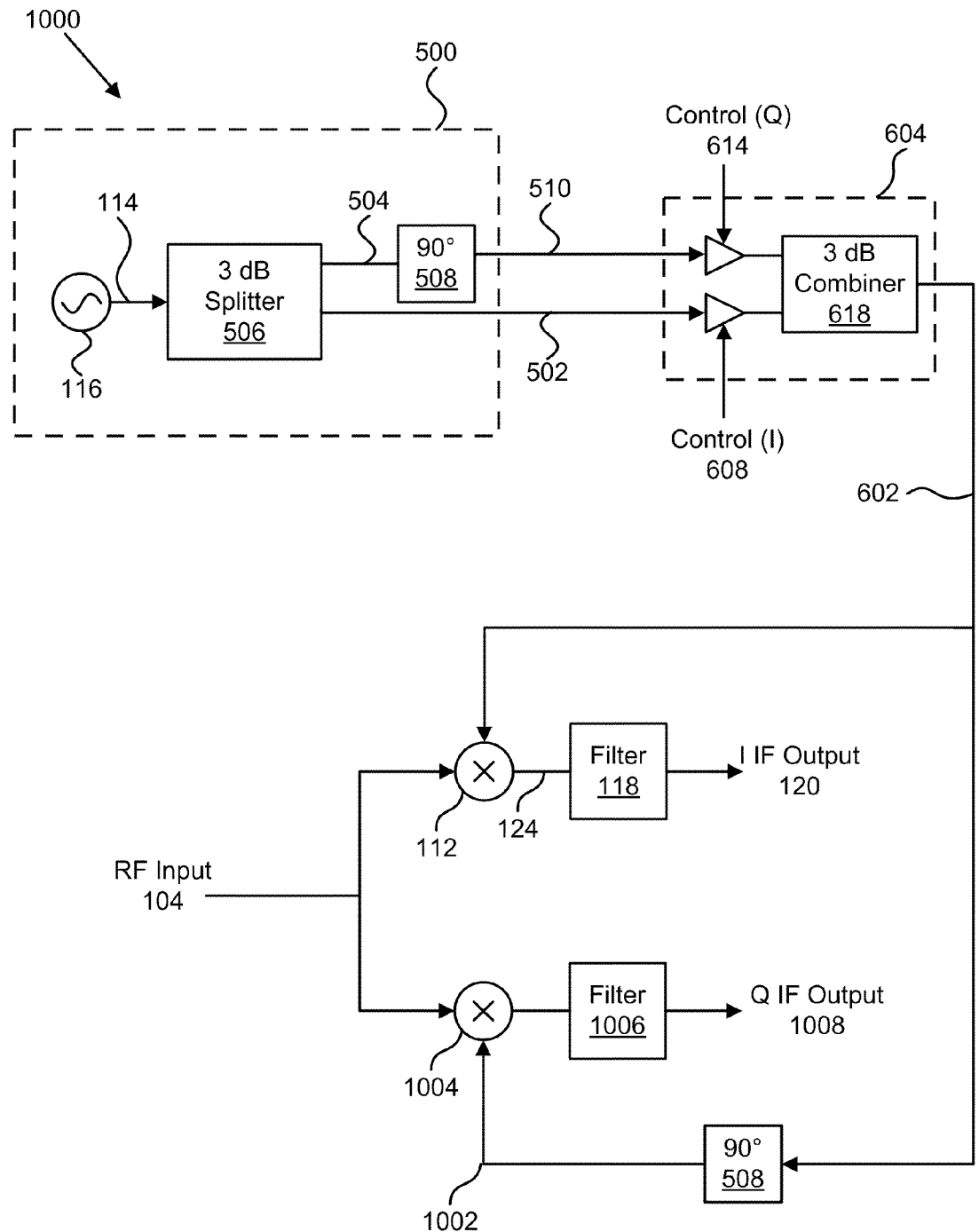
FIG. 10 is a schematic block diagram of a direct downconversion variable amplitude and phase shifter.

Thus, a phased array may be accomplished in a much more efficient and cost effective manner as compared to the prior art. A single two-phase local oscillator 500 can be used to feed an array of variable amplitude and phase shifters 600 with typically one variable amplitude and phase shifter 600 per RF signal 104 from an RF antenna. The in-phase control voltage 608 and quadrature control voltage 614 can be adjusted for each variable amplitude and phase shifter 600 to align the array of RF signals 104 and adjust for phase shift and amplitude variations caused by a physical separation between antennae. A more detailed discussion of a phased array of the present invention is below with respect to the apparatus 1100 of FIG. 11 and a variation is depicted in FIG. 10.

Figure 7:
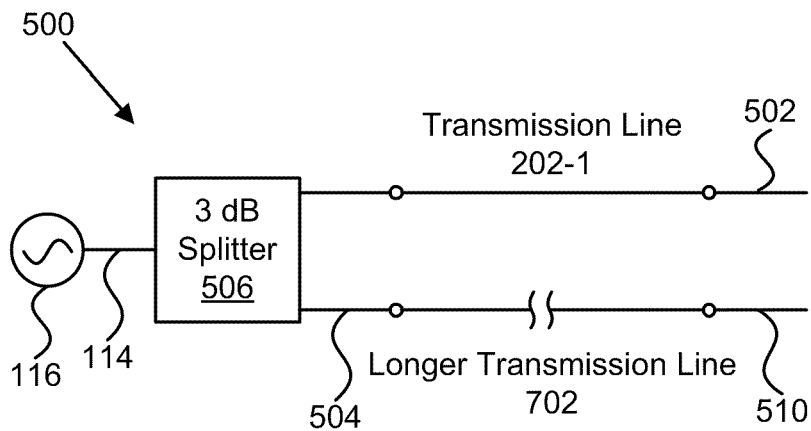
FIG. 7 is a schematic block diagram of a ninety degree transmission line phase shifter.

FIG. 7 is a schematic block diagram of a ninety degree transmission line phase shifter 702, shown in the context of a two-phase local oscillator 500. The ninety degree transmission line phase shifter 702 is one embodiment of a passive fixed phase shifter 508 that may be used with the phase array of the present invention. As can been seen, it is simply comprised of a single transmission line a quarter wave length in size, performing the function of a passive fixed phase shifter 508. It is thus much simpler and more cost-effective than the digital switched transmission line variable phase shifter 200, which not only requires many transmission lines 202, but also input and output switches 204 and 206. Nevertheless, even a single transmission line may be difficult to integrate on-chip due to size limitations.

An alternative embodiment that may be easier to integrate would be a capacitor circuit comprised of lumped elements, thus shortening the required length of the transmission line. Nevertheless, the lumped capacitive elements may still require considerable chip area.

Figure 8:
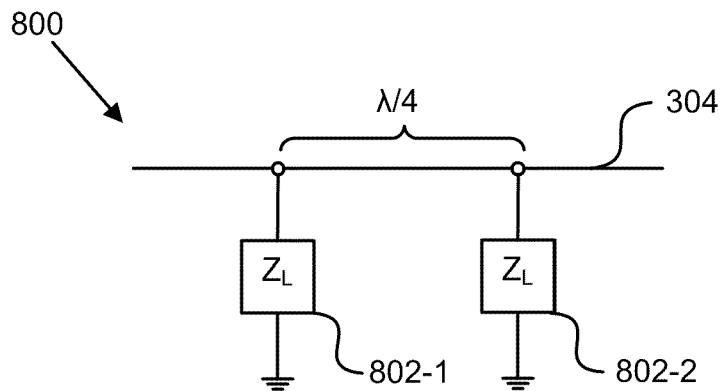
FIG. 8 is a schematic block diagram of a ninety degree loaded transmission line phase shifter.

FIG. 8 is a schematic block diagram of a ninety degree loaded transmission line phase shifter 800, which is another embodiment of a passive fixed phase shifter 508. In contrast with the digital loaded transmission line variable phase shifter 300, it only requires a small number of static loads 802. Furthermore, no switching capability is required, as is the case with the switched loads 302. This embodiment may be viewed as a composite of the transmission line and the lumped capacitance embodiments just described. The appropriate trade-offs to be made for a specific implementation would be apparent to one skilled in the art of chip design.

Figure 9:
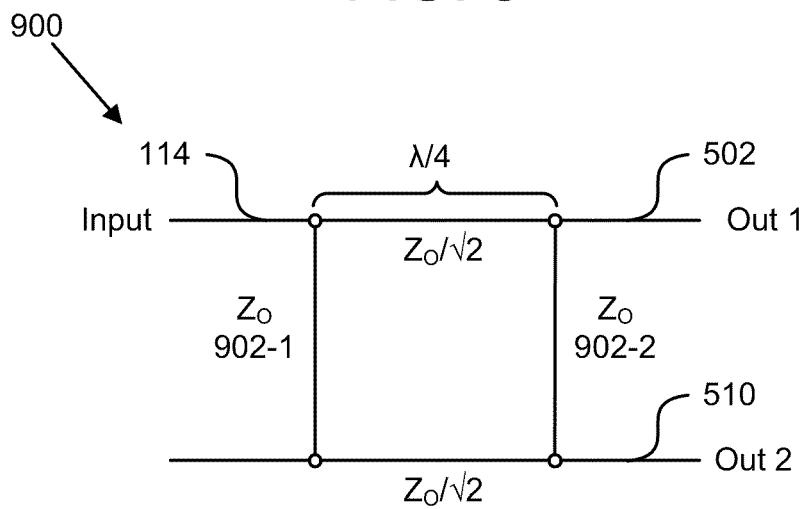
FIG. 9 is a schematic block diagram of a quadrature hybrid phase shifter.

FIG. 9 is a schematic block diagram of a quadrature hybrid phase shifter 900, which is yet another embodiment of a passive fixed phase shifter 508. In addition to a ninety degree phase shift between in-phase sinusoidal signal 502 and quadrature sinusoidal signal 510, the cross-coupling 902 within this circuit, with the proper impedance, also performs the function of splitter 506. In a further embodiment, the cross-coupled true and inverted outputs of a digital flip-flop, also known as a divide-by-two quadrature generator, may provide the in-phase sinusoidal signal 502 and quadrature sinusoidal signal 510 respectively, thus implementing the entire two-phase local oscillator 500 in a single circuit that is easily integrated on chip. Other similar embodiments would include polyphase filter quadrature generation and a quadrature voltage controlled oscillator.

Since direct downconversion receivers offer advantages such as ease of integration as compared to superheterodyne receivers, it would also be desirable to use the present invention in conjunction with a direct downconversion receiver. FIG. 10 is a schematic block diagram of a direct downconversion or zero-IF variable amplitude and phase shifter 1000 according to the present invention. A direct downconversion receiver is known in the prior art as an extension of the superheterodyne receiver, for which the carrier frequency α of the RF signal 104 is the same as the frequency ω of the sinusoidal LO signal 114. If ω and α are equal, then the IF signal given by Equation 5 is equal to −½ sin(φ), which is a constant, so that the IF frequency is zero. If the phase φ of the RF signal is zero, however, then the IF output is zero, and the IF signal does not carry complete information about the RF signal. To supply the missing information, the direct downconversion receiver requires a second mixer 1004 with a phase differing by ninety degrees for the LO signal 1002.

After low pass filters 118 and 1006 remove unwanted mixing products, the two independent IF outputs commonly labeled "I" for in-phase and "Q" for quadrature (1008) provide a complex baseband signal representation that can be supplied to signal detectors or other components for further processing. In FIG. 10, the direct downconversion receiver is modified in comparison to the prior art so that the in-phase LO signal 602 and the quadrature LO signal 1002 have controllable amplitude and phase. In order for the phase and amplitude shifting functionality to be properly implemented with a direct downconversion receiver, both the in-phase output and the quadrature output 1008 must receive the same phase and amplitude shift. Therefore, the phase and amplitude shifted LO signal generated by system block 604 must be split and presented to both mixers in the direct downconversion receiver. This modification causes the phase and amplitude of the complex baseband signal representation to be controllable, much as the system depicted in FIGS. 5 and 6 allows a standard superheterodyne mixer to perform the phase and amplitude shifting functions.

By a small adjustment of the frequency of the LO oscillator, so that the RF carrier frequency and the LO frequency are not exactly equal, the same architecture shown in FIG. 10 for the direct downconversion receiver can also be employed as a low-IF receiver with phase and amplitude shifting capability.

Figure 11:
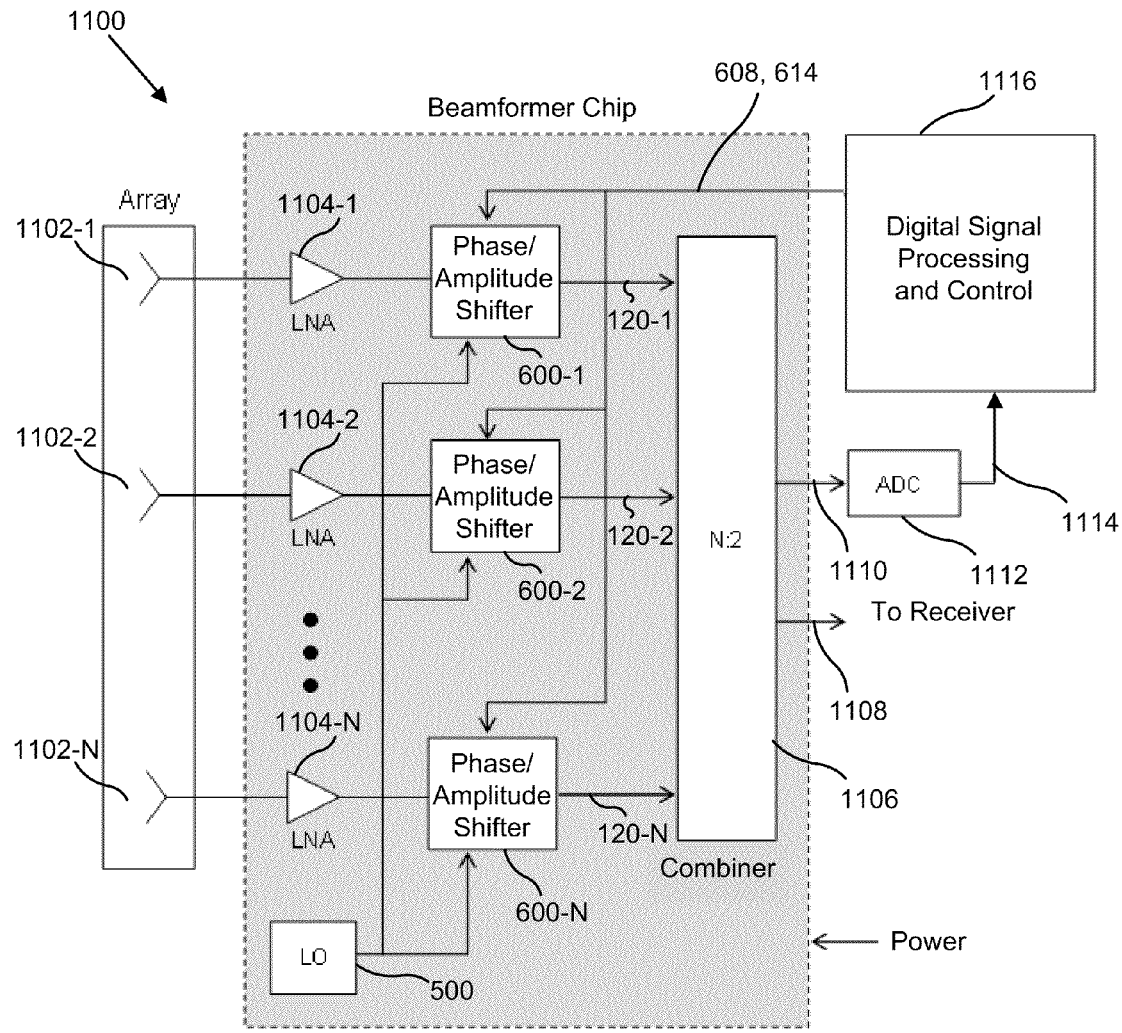
FIG. 11 is a schematic block diagram illustrating one embodiment of a phased array receiver in accordance with the present invention.

FIG. 11 is a schematic block diagram illustrating one embodiment of a phased array receiver 1100 in accordance with the present invention. The two-phase oscillator 500 drives a plurality of variable amplitude and phase shifters 600, which are controlled by a plurality of in-phase control voltages 608 and a plurality of quadrature control voltages 614, generating a plurality of IF signals 120 from a plurality of RF signals 104 received by a plurality of antennas 1102 and amplified by a plurality of low-noise amplifiers 1104.

The plurality of IF signals 120 are combined in a combiner 1106 to yield a combined IF signal 1108 and a copy of the combined IF signal 1110 to be fed back for control purposes. The combiner 1106 reinforces the desired signal by adding together the plurality of IF signals 120 when they have been brought into phase alignment and adjusted in amplitude by the plurality of variable amplitude and phase shifters 600. In one embodiment, the combiner 1106 is an integrated chip. In another embodiment, the combiner 1106 is made up of discrete elements. One of skill in the art will recognize how to implement the combiner 1106. Depending on the mixer conversion loss, additional gain may be required after the plurality of IF signals 120 are combined to increase the signal level.

In an application of the present invention, some means must be provided for generating the in-phase and quadrature voltage controls 608 and 614 for each phase and amplitude shifter. One such means, shown schematically in FIG. 11, employs a digital signal processing and control unit 1116 to sense the beamformer output and generate the control voltages 608 and 614 using a closed-loop feedback process. An analog to digital converter 1112 converts the copy of the combined IF signal 1110 to a digital IF signal 1114 which may be processed by a digital signal processor 1116 to algorithmically determine and provide the plurality of in-phase control voltages 608 and the plurality of quadrature control voltages 614 to the plurality of variable amplitude and phase shifters 600.

One type of control algorithm that could be implemented on the digital signal processing and control unit 1116 makes use of the amplitude control beneficially offered by the phase and amplitude shifter 600. The digital signal processor and control unit 1116 can periodically enter a training phase in which the phase and amplitudes of each array branch are rapidly adjusted in such a way that the digital signal processor 1116 and control unit can track the desired signal and maximize the output SNR (signal to noise ratio) for the signal of interest. One option for this training phase is the formation of sum and difference beams updated to maximize the desired signal level.

A second option for the control algorithm would be dithering of branch amplitudes, where the amplitude control functions of the phase and amplitude shifters 600 are used to make small adjustments to the amplitudes of each RF signal path according to a pattern that allows the digital signal processing and control unit 1116 to determine algorithmically how to update the in-phase control voltages 608 and quadrature control voltages 614 in such a way that the output SNR is maximized. The first of these options would require periodic signal dropouts during the training phase. This second approach would allow continuous signal delivery, since magnitude changes would be small enough that the combined output still achieved sufficient SNR for signal reception.

Other algorithms could also be implemented on the digital signal processing and control unit 1116 to generate the in-phase and quadrature voltage controls 608 and 614, including non-adaptive beamforming using a stored lookup table of control voltages based on known or pre-determined locations of the desired signal sources. Generation of the in-phase and quadrature voltage controls 608 and 614 could also be accomplished by an analog circuit which would replace the ADC 1114 and digital signal processing and control unit 1116.

These approaches combine the bandwidth handling capability of analog beamforming with the flexibility of digital beamforming. Fully digital beamforming would require that each array branch output be digitized and sampled. With many array elements and a broadband signal, the required digital signal processor 1116 is very expensive. The present invention allows a similar functionality to be realized using only one sampled and processed bit stream.

The amplitude control provided by the phase/amplitude shifters 600 also enables beam shaping for sidelobe reduction to optimize the SNR performance of the array receiver. For DBS (Direct Broadcast Satellite) receivers, spillover noise reduction is critical to achieving optimal SNR, so beam shaping using amplitude control is particularly beneficial for this application.

For some applications, the desired source can be tracked and identified using carrier-only information, since the digital processing does not necessarily need to decode modulated signal information. In such cases, to reduce the cost of the digital signal processor 1116, a narrowband filter can be included before the analog to digital converter 1112 to reduce the bit rate that must be processed. For frequency-reuse or multiband services, a tunable receiver may be needed before the analog to digital converter 1112.

In one embodiment, the plurality of variable amplitude and phase shifters 600 and the combiner 1106 are integrated onto a chip. In another embodiment, the two-phase local oscillator 500 may also be integrated onto the chip. In a further embodiment, the plurality of low noise amplifiers 1104 may also be integrated onto the chip. To reduce the chip pin count, a digital to analog converter (not shown) may be integrated onto the chip to generate the plurality of in-phase control voltages 608 and plurality of quadrature control voltages 614 indirectly from a digital control signal generated by the digital signal processor 1116. To scale up the size of the phased array receiver 1100, a plurality of combined IF signals provided by a plurality of identical chips may be combined together off-chip via a second stage combiner (not shown).

Figure 12:
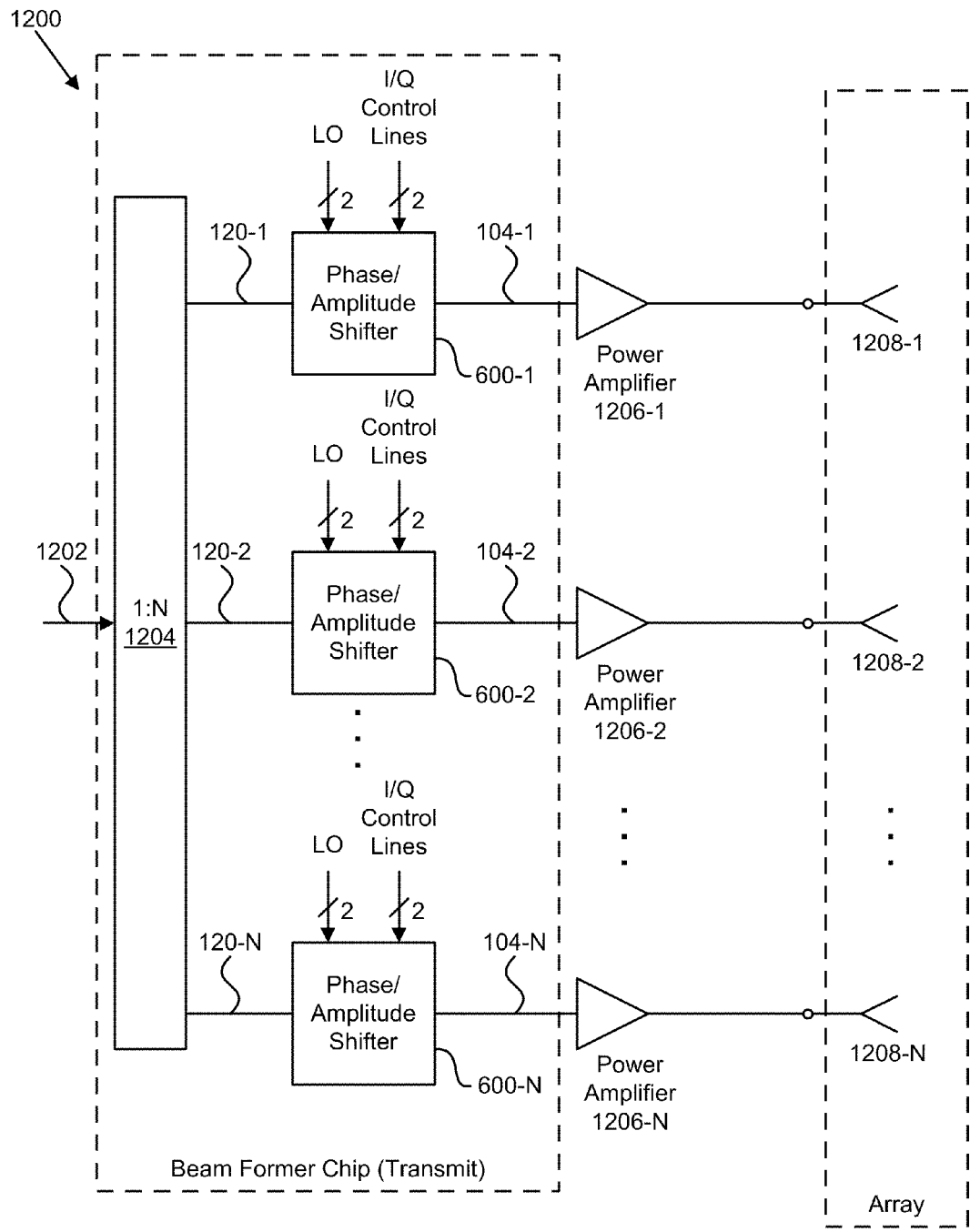
FIG. 12 is a schematic block diagram illustrating one embodiment of a phased array transmitter in accordance with the present invention.

FIG. 12 is a schematic block diagram illustrating one embodiment of a phased array transmitter 1200 in accordance with the present invention. The same plurality of variable amplitude and phase shifters 600 may be used, but with the plurality of RF signals 104 and the plurality of IF signals 120 reversed. The plurality of IF signals 120 is generated by splitting a source IF signal 1202 via a splitter 1204. The phase and amplitude of the plurality of RF signals 104 are controlled in the same manner as before, except that frequency upconversion instead of downconversion is performed through appropriate filtering, and the plurality of RF signals 104 are amplified by a plurality of power amplifiers 1206 to drive the plurality of antennas 1208.

Figure 13:
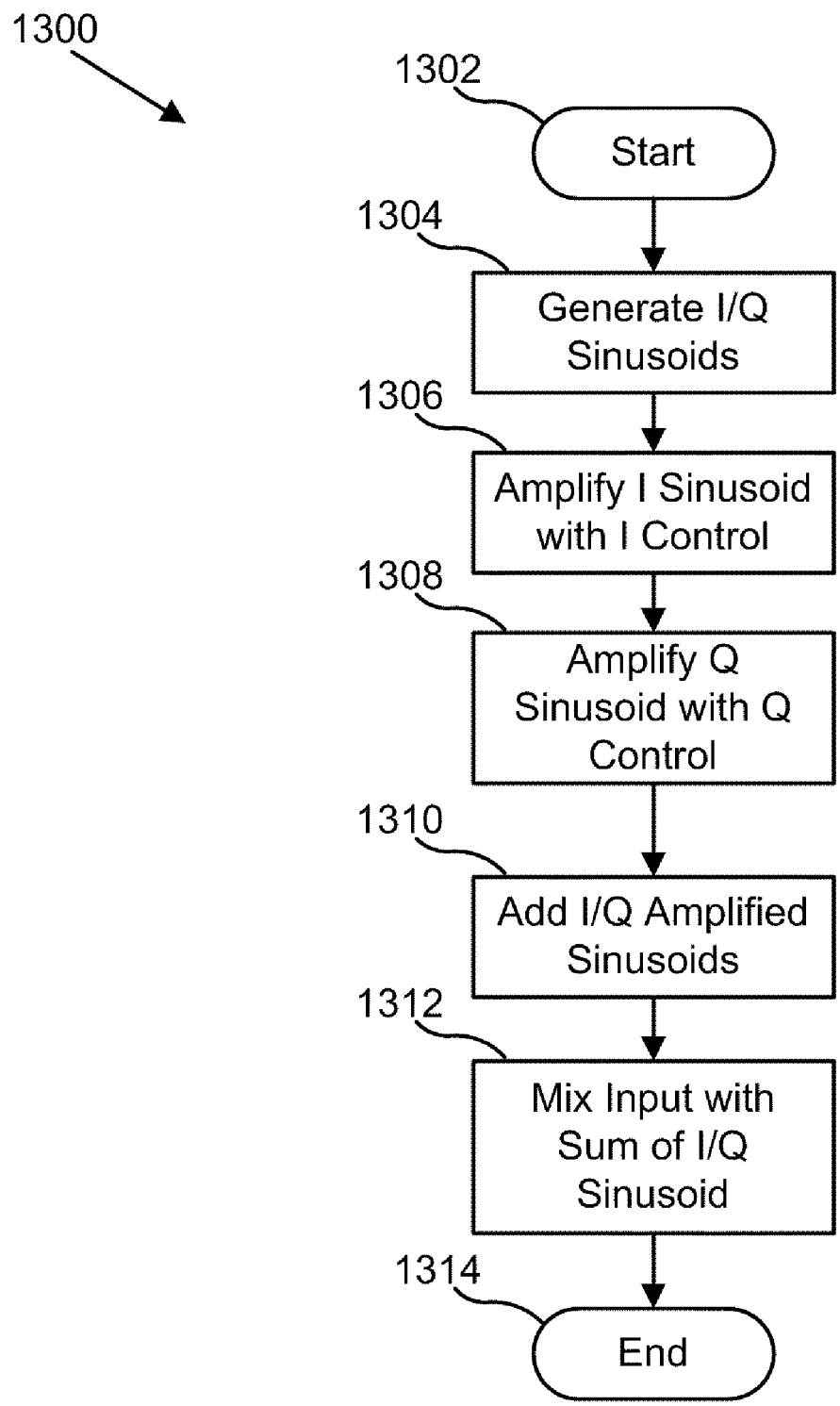
FIG. 13 is a schematic flow chart diagram illustrating one embodiment of a method for processing phased array signals according to the present invention.

FIG. 13 is a schematic flow chart diagram illustrating one embodiment of a method for processing phased array signals according to the present invention. The method 1300 begins 1302 and generates 1304 an in-phase sinusoidal signal 502 of a fixed frequency and a quadrature sinusoidal signal 510 of the fixed frequency having a ninety degree phase shift from the in-phase sinusoidal 502 signal. The method amplifies 1306 the in-phase sinusoidal signal 502 in response to an in-phase control voltage 608 to yield an in-phase amplified sinusoidal signal 610, and amplifies 1308 the quadrature sinusoidal signal 510 in response to a quadrature control voltage 614 to yield a quadrature amplified sinusoidal signal 616. The method adds 1310 the in-phase amplified sinusoidal signal 610 to the quadrature amplified sinusoidal signal 616 to yield a controllable sinusoidal signal 602. The method mixes 1312 the input signal 410 with the controllable sinusoidal signal 602 to generate the output signal 412 having an amplitude modulation and a phase shift with respect to the input signal 410 as dictated by the in-phase control voltage 608 and the quadrature control voltage 614, and the method ends 1314.

The input signal 410 and the output signal 412 carry phase and amplitude information required for phased array signal processing. The method 1300, in an embodiment, includes phased array signal transmission where the output signal 412 is a radio frequency signal to the antenna 1208 of the phased array 1200. In another embodiment, the method 1300 includes phased array signal reception where the input signal 410 is a radio frequency signal from the antenna 1102 of the phased array 1100.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An apparatus to process phased array signals, the apparatus comprising:
   a two-phase local oscillator that generates an in-phase sinusoidal signal of a fixed frequency and a quadrature sinusoidal signal of the fixed frequency having a ninety degree phase shift from the in-phase sinusoidal signal;
   a signal generator that receives the in-phase sinusoidal signal and the quadrature sinusoidal signal and generates a controllable sinusoidal signal of the fixed frequency, wherein the controllable sinusoidal signal comprises a shiftable phase; and
   a mixer that varies an amplitude and shifts a phase of an input signal by mixing the input signal with the controllable sinusoidal signal to generate an output signal, wherein the input signal and the output signal carry phase and amplitude information required for phased array signal processing, wherein the controllable sinusoidal signal further comprises a variable amplitude.

2. The apparatus of claim 1, wherein the signal generator further comprises one or more of:
   an in-phase variable gain amplifier that amplifies the in-phase sinusoidal signal in response to an in-phase control voltage to yield an in-phase amplified sinusoidal signal;
   a quadrature variable gain amplifier that amplifies the quadrature sinusoidal signal in response to a quadrature control voltage to yield a quadrature amplified sinusoidal signal; and
   a combiner that adds the in-phase amplified sinusoidal signal to the quadrature amplified sinusoidal signal to yield the controllable sinusoidal signal.

3. The apparatus of claim 1, wherein the two-phase local oscillator further comprises one or more of:
   a local oscillator that generates a sinusoidal signal of the fixed frequency;
   a splitter that splits the sinusoidal signal into the in-phase sinusoidal signal and a copy of the in-phase sinusoidal signal; and
   a passive fixed phase shifter that shifts the copy of the in-phase sinusoidal signal by ninety degrees to yield the quadrature sinusoidal signal.

4. The apparatus of claim 1, wherein the output signal comprises a radio frequency signal to an antenna of the phased array.

5. The apparatus of claim 1, wherein the input signal comprises a radio frequency signal from an antenna of the phased array.

6. The apparatus of claim 5, wherein the mixer incorporates a first stage frequency downconversion to yield an intermediate frequency signal as the output signal.

7. The apparatus of claim 6, wherein the controllable sinusoidal signal further comprises a variable amplitude and wherein the downconversion is low-IF in that the fixed frequency is approximately equal to a carrier frequency of the radio frequency signal and further comprising a quadrature mixer that varies the amplitude and shift the phase of the input signal by mixing it with a quadrature controllable sinusoidal signal to generate a quadrature output signal.

8. The apparatus of claim 7, wherein the downconversion is direct in that the fixed frequency is equal to the carrier frequency.

9. The apparatus of claim 1, further comprising a filter to remove spurious mixing products from the output signal to yield a filtered output signal.

10. The apparatus of claim 9, further comprising an amplifier that compensates for conversion loss by amplifying the filtered output signal to yield an amplified output signal.

11. The apparatus of claim 1, wherein the fixed frequency is tunable.

12. A system to process phased array signals, the system comprising:
   a two-phase local oscillator that generates an in-phase sinusoidal signal of a fixed frequency and a quadrature sinusoidal signal of the fixed frequency having a ninety degree phase shift from the in-phase sinusoidal signal;
   a plurality of signal generators that respectively generate a plurality of controllable sinusoidal signals of the fixed frequency, of a variable amplitude, and of a shiftable phase, from the in-phase sinusoidal signal and the quadrature sinusoidal signal, in response to a plurality of in-phase control voltages and a plurality of quadrature control voltages;
   a plurality of mixers that respectively vary the amplitude and shift the phase of a plurality of input signals by mixing them with the plurality of controllable sinusoidal signals from the plurality of signal generators to generate a plurality of output signals;
   a plurality of low noise amplifiers that respectively amplify a plurality of radio frequency signals from a plurality of antennas of a phased array to yield the plurality of input signals;

a combiner that combines the plurality of output signals to yield a combined output signal and a copy of the combined output signal;

an analog-to-digital converter that converts the copy of the combined output signal to a digital output signal; and a digital signal processor that algorithmically determines and provides the plurality of in-phase control voltages and the plurality of quadrature control voltages to the plurality of signal generators.

13. The system of claim 12, wherein the plurality of signal generators, the plurality of mixers, and the combiner are integrated onto a chip.

14. The system of claim 13, wherein the two-phase local oscillator is integrated onto the chip.

15. The system of claim 13, wherein the plurality of low noise amplifiers is integrated onto the chip.

16. The system of claim 13, further comprising a digital to analog converter integrated onto the chip to generate the plurality of in-phase control voltages and the plurality of quadrature control voltages from a digital control signal generated by the digital signal processor.

17. The system of claim 13, wherein the chip is partitioned into a plurality of identical chips yielding a plurality of partitioned combined output signals, further comprising a second stage combiner to combine the plurality of partitioned combined output signals into the combined output signal.

18. A method for processing phased array signals, the method comprising the steps of:

generating an in-phase sinusoidal signal of a fixed frequency and a quadrature sinusoidal signal of the fixed frequency having a ninety degree phase shift from the in-phase sinusoidal signal;

amplifying the in-phase sinusoidal signal in response to an in-phase control voltage to yield an in-phase amplified sinusoidal signal;

amplifying the quadrature sinusoidal signal in response to a quadrature control voltage to yield a quadrature amplified sinusoidal signal;

adding the in-phase amplified sinusoidal signal to the quadrature amplified sinusoidal signal to yield a controllable sinusoidal signal; and mixing an input signal with the controllable sinusoidal signal to generate an output signal having an amplitude modulation and a phase shift with respect to the input signal as dictated by the in-phase control voltage and the quadrature control voltage, wherein the input signal and the output signal carry phase and amplitude information required for phased array signal processing.

19. The method of claim 18, wherein one of:

the output signal is a radio frequency signal to an antenna of the phased array; and the input signal is a radio frequency signal from an antenna of the phased array.

* * * * *